(12) United States Patent
Kitagawa et al.

(10) Patent No.: US 10,629,794 B2
(45) Date of Patent: Apr. 21, 2020

(54) THERMOELECTRIC POWER GENERATION DEVICE AND METHOD FOR MANUFACTURING SAME

(71) Applicant: DENSO CORPORATION, Kariya, Aichi-pref. (JP)

(72) Inventors: Shinya Kitagawa, Kariya (JP); Takuya Matsuda, Kariya (JP)

(73) Assignee: DENSO CORPORATION, Kariya, Aichi-pref. (JP)

( * ) Notice: Subject to any disclaimer, the term of this patent is extended or adjusted under 35 U.S.C. 154(b) by 110 days.

(21) Appl. No.: 15/758,818

(22) PCT Filed: Sep. 13, 2016

(86) PCT No.: PCT/JP2016/076909
§ 371 (c)(1),
(2) Date: Mar. 9, 2018

(87) PCT Pub. No.: WO2017/047562
PCT Pub. Date: Mar. 23, 2017

(65) Prior Publication Data
US 2019/0088844 A1  Mar. 21, 2019

(30) Foreign Application Priority Data
Sep. 16, 2015 (JP) .................. 2015-183254
Aug. 8, 2016 (JP) .................. 2016-155818

(51) Int. Cl.
*H01L 35/30* (2006.01)
*F28F 1/02* (2006.01)
(Continued)

(52) U.S. Cl.
CPC .............. *H01L 35/30* (2013.01); *F01N 5/025* (2013.01); *F01N 13/1872* (2013.01);
(Continued)

(58) Field of Classification Search
CPC ..... F01N 5/025; F01N 13/1888; H01L 35/30; H01L 35/32
See application file for complete search history.

(56) References Cited

U.S. PATENT DOCUMENTS

2006/0157102 A1* 7/2006 Nakajima ............... F01N 5/025
136/205
2007/0045044 A1* 3/2007 Sullivan .................... F01N 1/02
181/268

(Continued)

FOREIGN PATENT DOCUMENTS

AT      506262 A2     7/2009
CN   104567086 A     4/2015
(Continued)

*Primary Examiner* — Eli S Mekhlin
(74) *Attorney, Agent, or Firm* — Harness, Dickey & Pierce, P.L.C.

(57) ABSTRACT

Each of a first outside plate and a second outside plate includes bent portions at its both ends in a direction perpendicular to a direction in which a low-temperature fluid flows. The bent portions of the first outside plate and the bent portions of the second outside plate are respectively welded together in a resiliently deformed state to approach each other. The bent portions of the first outside plate and the bent portions of the second outside plate are respectively welded together to generate stress to press a first power generation module and a second power generation module on a duct.

39 Claims, 22 Drawing Sheets

(51) Int. Cl.
 *F28D 7/16* (2006.01)
 *F28D 9/00* (2006.01)
 *F01N 5/02* (2006.01)
 *F01N 13/18* (2010.01)
 *F28D 21/00* (2006.01)
 *H01L 35/32* (2006.01)

(52) U.S. Cl.
 CPC ....... *F01N 13/1888* (2013.01); *F28D 7/1684* (2013.01); *F28D 9/0081* (2013.01); *F28D 21/0003* (2013.01); *F28F 1/022* (2013.01); *H01L 35/32* (2013.01); *Y02T 10/16* (2013.01)

(56) References Cited

U.S. PATENT DOCUMENTS

| | | |
|---|---|---|
| 2011/0252774 A1 | 10/2011 | Spieth et al. |
| 2011/0265838 A1 | 11/2011 | Kambe |
| 2012/0012146 A1* | 1/2012 | Salzgeber ............... F01N 5/025 136/205 |
| 2015/0101356 A1 | 4/2015 | Oh et al. |

FOREIGN PATENT DOCUMENTS

| | | |
|---|---|---|
| DE | 102011076641 A1 | 11/2012 |
| JP | H09079766 A | 3/1997 |
| JP | H09243287 A | 9/1997 |
| JP | H11036981 A | 2/1999 |
| JP | 2011101460 A | 5/2011 |
| JP | 2011109837 A | 6/2011 |
| JP | 4719747 B2 | 7/2011 |
| JP | 2011181767 A | 9/2011 |
| JP | 2012156227 A | 8/2012 |
| JP | 2013232500 A | 11/2013 |
| JP | 2014059087 A | 4/2014 |
| WO | WO-2007026432 A1 | 3/2007 |
| WO | WO-2010084718 A1 | 7/2010 |

\* cited by examiner

THERMOELECTRIC POWER GENERATION DEVICE AND METHOD FOR MANUFACTURING SAME

CROSS REFERENCE TO RELATED APPLICATIONS

This application is a U.S. National Phase Application under 35 U.S.C. 371 of International Application No. PCT/JP2016/076909 filed on Sep. 13, 2016 and published in Japanese as WO 2017/047562 A1 on Mar. 23, 2017. This application is based on and claims the benefit of priority from Japanese Patent Application No. 2015-183254 filed on Sep. 16, 2015 and Japanese Patent Application No. 2016-155818 filed on Aug. 8, 2016. The entire disclosures of all of the above applications are incorporated herein by reference.

TECHNICAL FIELD

The present disclosure relates generally to a thermoelectric power generation device that thermoelectrically generates electric power by the use of a high-temperature fluid and a low-temperature fluid and to a method for manufacturing the same. In particular, the present disclosure relates to a thermoelectric power generation device utilizing an exhaust gas of a vehicle and a method for manufacturing the same.

BACKGROUND ART

There is proposed a thermoelectric power generation device described in Patent Document 1. In this device, when the device is operated, a power generation module, a member on a low temperature side, and a member on a high temperature side are different from each other in a coefficient of thermal expansion, so it is concerned that a power generation element in the power generation module is broken by a thermal strain caused by a difference in the coefficient of thermal expansion. For this reason, the thermoelectric power generation device employs a structure in which the power generation module, the member on the low temperature side, and the member on the high temperature side are not firmly fixed.

Further, in order to enable heat to be transferred between the power generation module, the member on the low temperature side, and the member on the high temperature side, a close contact between the power generation module, the member on the low temperature side, and the member on the high temperature side is secured by inserting a heat conducting member between the power generation module, the member on the low temperature side, and the member on the high temperature side and by using a fastening member such as a bolt.

PRIOR ART DOCUMENT

Patent Document

Patent Document 1: JP 2011-101460 A

According to a technique of the Patent Document 1, the fastening member such as the bolt for fastening is newly required, which hence increases the number of parts, a material cost of a product, and a manufacturing cost. Further, this increase in the number of parts results in increasing a heat capacity which does not contribute to a heat exchange performance. This causes a decrease in a transfer amount of effective heat at an initial stage of operation of the power generation device and hence causes a decrease in a power generation amount, so a sufficient power generation performance cannot be produced. Descriptions of the patent document cited as a prior art can be introduced or incorporated as descriptions of technical elements described in the present specification.

SUMMARY OF INVENTION

The present disclosure addresses the above issues. Thus, it is an objective of the present disclosure to provide a thermoelectric power generation device that inhibits a decrease in a power generation performance and a method for manufacturing the same.

To achieve the objective, a thermoelectric power generation device in a first aspect of the present disclosure includes a duct in which a low-temperature fluid flows, a first power generation module and a second power generation module which are in contact with opposed outside surfaces of the duct respectively to clamp the duct therebetween and each of which includes therein a thermoelectric power generation element, a first outside plate and a second outside plate each of which is in contact with an outside surface of a corresponding one of the first power generation module and the second power generation module on its opposite side from the duct, and outside fins each of which is provided on an outside surface of a corresponding one of the first outside plate and the second outside plate on its opposite sides from a corresponding one of the first power generation module and the second power generation module, and which are in contact with a high-temperature fluid. Each of the first outside plate and the second outside plate includes bent portions at its both ends in a direction perpendicular to a direction in which the low-temperature fluid flows. The bent portions of the first outside plate and the bent portions of the second outside plate are respectively welded together in a resiliently deformed state to approach each other. The bent portions of the first outside plate and the bent portions of the second outside plate are respectively welded together to generate stress that presses the first power generation module and the second power generation module on the duct.

According to this, the outside plates have the bent portions, which are welded to each other in such a way as to come close to each other, on both their ends in the direction orthogonal to the direction in which a first fluid flows and the stress to press the power generation module onto the duct is generated by welding the bent portions to each other. Hence, a close contact between the power generation module, the first outside plate, and the second outside plate is improved and hence a power generation performance is improved. Further, a fastening member such as a bolt for securing and keeping the close contact is not required and hence an increase in a heat capacity by a member which does not contribute to a heat exchange performance can be inhibited. Hence, it is possible to provide the thermoelectric power generation device that does not cause a decrease in a transfer amount of effective heat and a decrease in a power generation amount at the initial stage of operation of the power generation device and that can hence produce a sufficient performance.

A thermoelectric power generation device in a second aspect of the present disclosure includes a duct in which a low-temperature fluid flows, a first power generation module and a second power generation module which are in contact with opposed outside surfaces of the duct respectively to clamp the duct therebetween and each of which includes therein a thermoelectric power generation element, a first outside plate and a second outside plate each of which is in contact with an outside surface of a corresponding one of the first power generation module and the second power generation module on its opposite side from the duct, and outside fins each of which is provided on an outside surface of a corresponding one of the first outside plate and the second outside plate on its opposite sides from a corresponding one of the first power generation module and the second power generation module, and which are in contact with a high-temperature fluid. Each of the first outside plate and the second outside plate includes bent portions at its both ends in a direction perpendicular to a direction in which the low-temperature fluid flows. The bent portions of the first outside plate and the bent portions of the second outside plate are respectively welded together in a resiliently deformed state such that at least one of the first outside plate and the second outside plate approaches the other one of the first outside plate and the second outside plate. The bent portions of the first outside plate and the bent portions of the second outside plate are respectively welded together to generate stress that presses the first power generation module and the second power generation module on the duct.

According to this thermoelectric power generation device, the outside plates have the bent portions, which are welded to each other in a resiliently deformed state in such a way that at least one of the outside plates come close to the other of the outside plates, on both their ends in the direction orthogonal to the direction in which a first fluid flows. The stress to press the first power generation module and the second power generation module onto the duct is generated by welding the bent portions to each other. Hence, a close contact between the respective power generation modules, the first outside plate, and the second outside plate is improved and a close contact between the respective power generation modules and the duct is improved, and hence a power generation performance is improved. Further, a fastening member such as a bolt for securing and keeping the close contacts is not required and hence an increase in a heat capacity by a member which does not contribute to a heat exchange performance can be inhibited. Hence, it is possible to provide the thermoelectric power generation device that does not cause a decrease in a transfer amount of effective heat and a decrease in a power generation amount at the initial stage of operation of the power generation device and that can hence produce a sufficient performance.

A thermoelectric power generation device in a third aspect of the present disclosure includes a duct in which a low-temperature fluid flows, a power generation module that includes therein a thermoelectric power generation element and is in contact with one of opposed outside surfaces of the duct, a first outside plate that is in contact with an outside surface of the power generation module on its opposite side from the duct, a second outside plate that is in direct or indirect contact with the outside surface of the duct on its opposite side from the power generation module, and outside fins each of which is provided on an outside surface of a corresponding one of the first outside plate and the second outside plate on its opposite sides from the power generation module, and which are in contact with a high-temperature fluid. Each of the first outside plate and the second outside plate includes bent portions at its both ends in a direction perpendicular to a direction in which the low-temperature fluid flows. The bent portions of the first outside plate and the bent portions of the second outside plate are respectively welded together in a resiliently deformed state such that at least one of the first outside plate and the second outside plate approaches the other one of the first outside plate and the second outside plate. The bent portions of the first outside plate and the bent portions of the second outside plate are respectively welded together to generate stress that presses the power generation module on the duct.

According to this thermoelectric power generation device, the outside plates have the bent portions, which are welded to each other in a resiliently deformed state in such a way that at least one of the outside plates come close to the other of the outside plates, on both their ends in the direction orthogonal to the direction in which a first fluid flows. The stress to press the first power generation module and the second power generation module onto the duct by welding the bent portions to each other. Hence, a close contact between the power generation module, the first outside plate, and the second outside plate is improved and a close contact between the power generation module and the duct is improved, and hence a power generation performance is improved. Further, a fastening member such as a bolt for securing and keeping the close contacts is not required and hence an increase in a heat capacity by a member which does not contribute to a heat exchange performance can be inhibited. Hence, it is possible to provide the thermoelectric power generation device that does not cause a decrease in a transfer amount of effective heat and a decrease in a power generation amount at the initial stage of operation of the power generation device and that can hence produce a sufficient performance.

According to a method for manufacturing a thermoelectric power generation device including a duct in which a low-temperature fluid flows, power generation modules each of which includes therein a thermoelectric power generation element, a first outside plate, and a second outside plate in a fourth aspect of the present disclosure, an arranging process is performed, in which the first outside plate and the second outside plate are opposed to each other, and the power generation modules and the duct are arranged between the first outside plate and the second outside plate, such that each of the first outside plate and the second outside plate is in contact with an outside of a corresponding one of the power generation modules on its opposite side from the duct, and that each of the power generation modules is in contact with a corresponding one of opposed outside surfaces of the duct. Moreover, a pressing process is performed, in which the first outside plate and the second outside plate are pressurized such that the first outside plate and the second outside plate approach each other to generate stress that presses each of the first outside plate and the second outside plate on a corresponding one of the power generation modules. In addition, a welding process is performed, in which the first outside plate and the second outside plate are welded together in a state where the stress is generated.

According to the method for manufacturing a thermoelectric power generation device, it is possible to manufacture the thermoelectric power generation device in which the outside plates have both their ends in the direction orthogonal to the direction in which a first fluid flows welded to each other in such a way as to come close to each other and in which the stress to press the power generation module onto the duct is generated by welding both their ends to each other. Hence, a close contact between the power generation module, the first outside plate, the second outside plate, and the duct is improved, and hence a power generation performance is improved. Further, a fastening member such as a bolt for securing and keeping the close contacts is not required and hence an increase in a heat capacity by a member which does not contribute to a heat exchange performance can be inhibited. Hence, it is possible to provide the method for manufacturing a thermoelectric power generation device that does not cause a decrease in a transfer amount of effective heat and a decrease in a power generation amount at the initial stage of operation of the power generation device and that can hence produce a sufficient performance.

BRIEF DESCRIPTION OF DRAWINGS

The above and other objects, features and advantages of the present disclosure will become more apparent from the following detailed description made with reference to the accompanying drawings. In the drawings.

EMBODIMENTS FOR CARRYING OUT INVENTION

Hereinafter, a plurality of embodiments for carrying out the present disclosure will be described with reference to accompanying drawings. In some cases, parts corresponding to terms described in the preceding embodiment in the respective embodiments will be denoted by the same reference signs and their duplicate descriptions will be omitted. In a case where a part of a construction is described in the respective embodiments, the other embodiment described precedently can be applied to the other parts of the construction. Not only a combination of parts which are specified to be completely combined with each other in the respective embodiments but also even if not specified, a partial combination of the embodiments can be made if a problem is not caused in the combination of them.

First Embodiment

Figure 1:
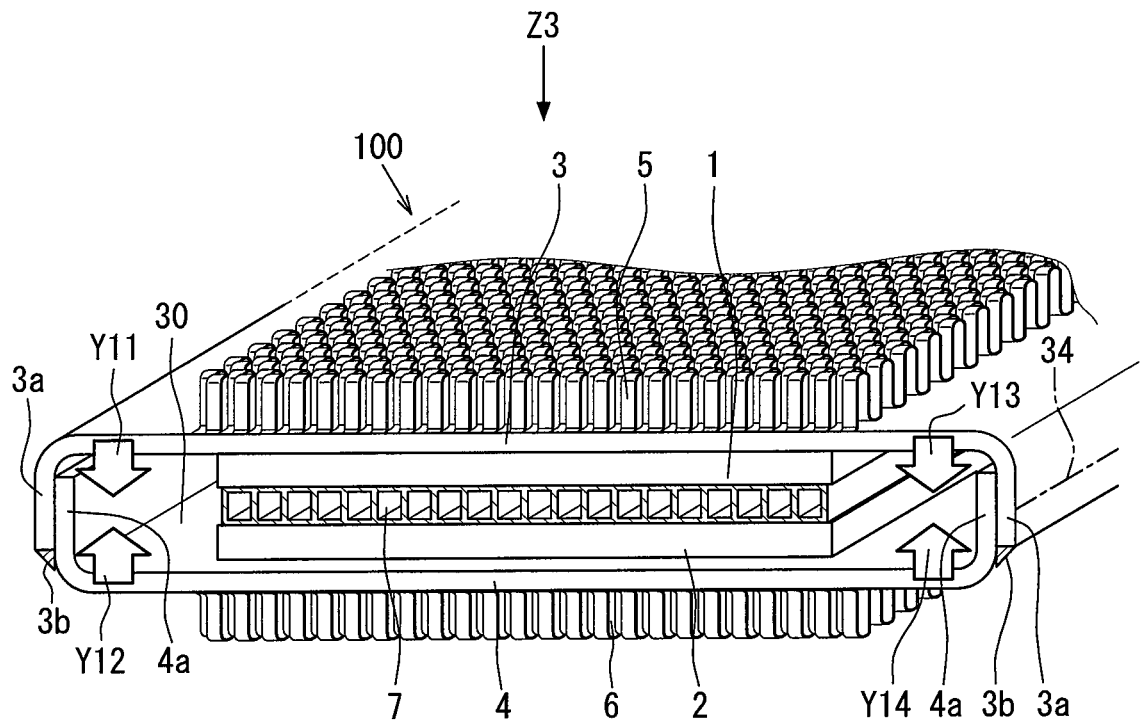
FIG. 1 is a perspective view to show a part of a thermoelectric power generation device in a first embodiment.

Hereinafter, a first embodiment will be described in detail by the use of FIG. 1 to FIG. 6. FIG. 1 is a construction view, partially in a cross section, of a thermoelectric power generation device 100. A first power generation module 1 and a second power generation module 2 are received in an airtight case formed in a shape of a flat box so as to prevent elements from being oxidized. Hence, each of the power generation modules 1, 2 can be seen only as a box shaped like a plate when viewed from the outside, but many p-type semiconductor elements and n-type semiconductor elements are alternately connected to each other like a net in the air-tight case constructed of a thin stainless steel plate. When the power generation module has one surface brought into contact with a high temperature part and has the other surface brought into contact with a low temperature part, the power generation module generates electric power.

One surfaces of the respective power generation modules 1, 2 are brought into contact with a first outside plate 3 and a second outside plate 4 each of which forms the high temperature part. In some cases, the first outside plate 3 and the second outside plate 4 will be collectively referred to simply as outside plates 3, 4. The first outside plate 3 and the second outside plate 4 are bent in such a way that both their end portions are welded to each other. Bent portions 3*a*, 4*a* of portions bent in this manner are welded to each other by a seam welding or a laser welding in a direction parallel to a direction in which a low-temperature fluid flows in a duct 7. An internal space 30 surrounded by the first outside plate 3 and the second outside plate 4 is formed by this welding. The generation modules 1, 2 and the duct 7 are received in the internal space 30 surrounded by the first outside plate 3 and the second outside plate 4. The duct 7 is made of aluminum or stainless steel, and the low-temperature fluid made of a cooling water of an automobile engine flows in the duct 7. The duct 7 has flat obverse and reverse outside surfaces.

Outside fins 5, 6 are provided respectively on outsides (upper side and lower side in FIG. 1), which are sides opposite to the power generation modules, of the first outside plate 3 and the second outside plate 4. An exhaust gas of the automobile engine, which becomes a high-temperature fluid, flows in contact with these outside fines 5, 6. Inside surfaces, which are the other surfaces of the power generation modules 1, 2, are brought into contact with the outside surfaces of the duct 7 which forms the low temperature part. An interior of the duct 7 is partitioned into a plurality of flow passages and the cooling water which becomes the low-temperature fluid flows in the plurality of flow passages.

In this regard, although it is the thermoelectric power generation device 100 made of one power generation unit that is shown in FIG. 1, the power generation units like this may be laminated in a plurality of layers. Even in this case, the high-temperature fluid flows in contact with the outside fins 5, 6 which are positioned between the laminated power generation units.

When the first outside plate 3 and the second outside plate 4 are combined with each other, the first outside plate 3 and the second outside plate 4 are pressed as shown by arrows Y11 to Y14 in such a way that the bent portions 3*a*, 4*a* increase their overlapping portions. The bent portions 3*a*, 4*a* are welded to each other in this pressed state by the seam welding or the laser welding. Hence, stresses to sandwich the power generation modules 1, 2 are applied to the first outside plate 3 and the second outside plate 4, whereby a product is completed. In this way, the power generation modules 1, 2 are easily brought into close contact with the first outside plate 3 and the second outside plate 4 and the duct 7. In other words, pressing forces by the stresses are applied between the duct 7 and the power generation modules 1, 2 and between the power generation modules 1, 2 and the first outside plate 3 and the second outside plate 4 to thereby form pressure contact portions between these.

Figure 2:
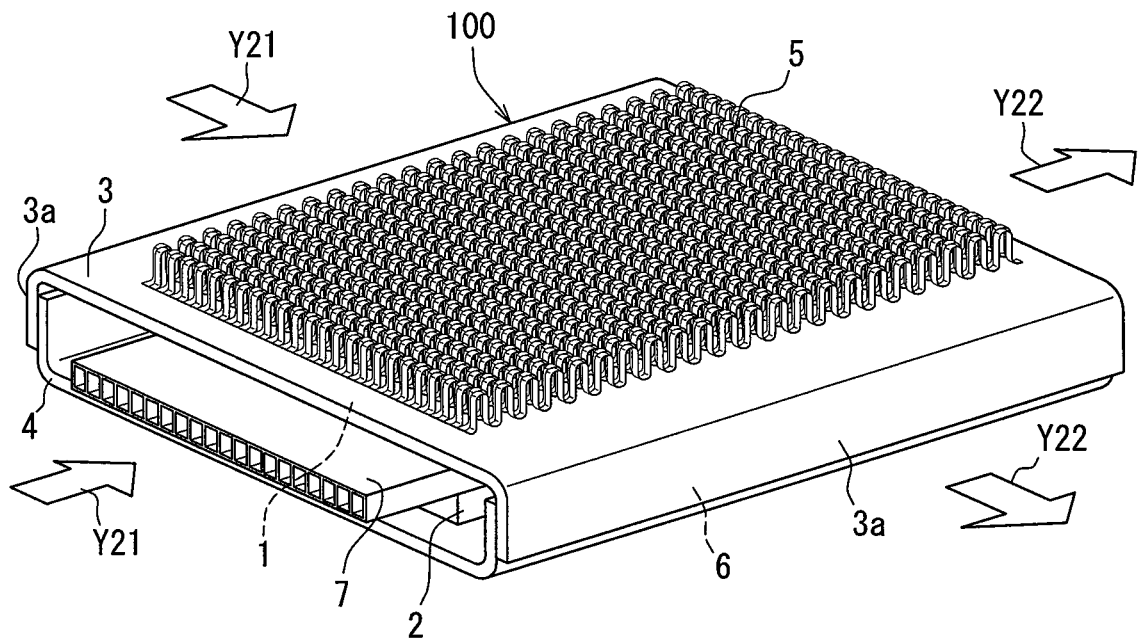
FIG. 2 is a perspective view of the thermoelectric power generation device in the first embodiment.

FIG. 2 is a perspective view of the whole of the thermoelectric power generation device 100. This thermoelectric power generation device 100 is a laminated body constructed of the outside fin 5, the first outside plate 3, the first power generation module 1, the duct 7, the second power generation module 2, the second outside plate 4, and the outside fin 6 from above to down in FIG. 2. In the duct 7, the low-temperature fluid flows as shown by arrows Y21, Y22. In the outside fins 5, 6, the high-temperature fluid flows in contact with the outside fins 5, 6 as shown by the arrows Y21, Y22, whereby the high-temperature fluid exchanges heat with the outside fins 5, 6.

Figure 3:
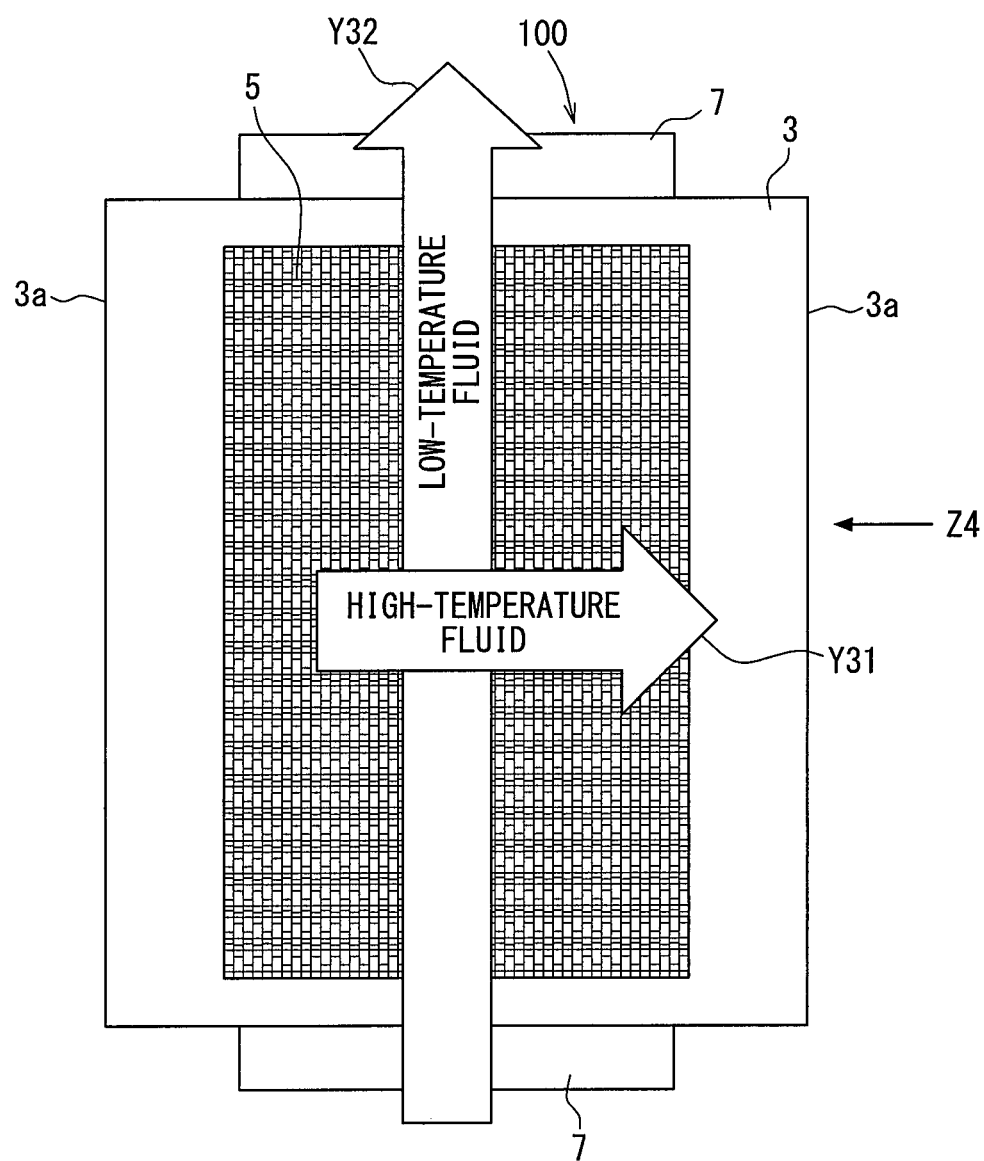
FIG. 3 is a plan view of the thermoelectric power generation device, when viewed from a direction shown by an arrow Z3 of FIG. 1, in the first embodiment.
Figure 4:
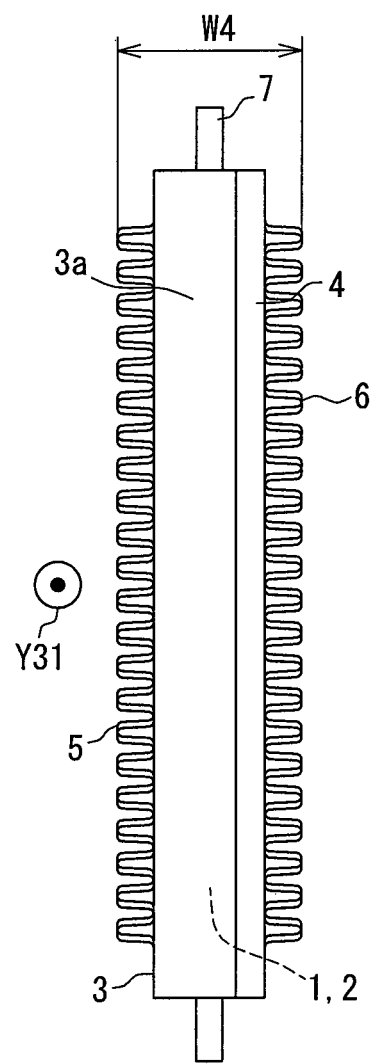
FIG. 4 is a right side view of the thermoelectric power generation device, when viewed from a direction shown by an arrow Z4 of FIG. 3, in the first embodiment.

FIG. 3 is a plan view, when viewed from a direction shown by an arrow Z3 of FIG. 1, of the thermoelectric power generation device 100. FIG. 4 is a right side view, when viewed from a direction shown by an arrow Z4 of FIG. 3, of the thermoelectric power generation device 100. A direction shown by the arrow Y31 of FIG. 3 is a direction in which the high-temperature fluid flows. Further, an engine cooling water which becomes the low-temperature fluid, as shown by an arrow Y32 of FIG. 3, flows in such a way as to be orthogonal to the direction in which the high-temperature fluid flows. The low-temperature fluid flows in the duct 7 having the plurality of flow passages which are arranged in a central portion of FIG. 1 and which are partitioned. The power generation modules 1, 2 are provided respectively on one surface side and the other surface side of the duct 7. The pair of power generation modules 1, 2 sandwiches the duct 7 in the inside and have their outsides sandwiched by the first outside plate 3 and the second outside plate 4. A width W4 between the outside fins 5, 6 is 35 mm as an example.

Figure 5:
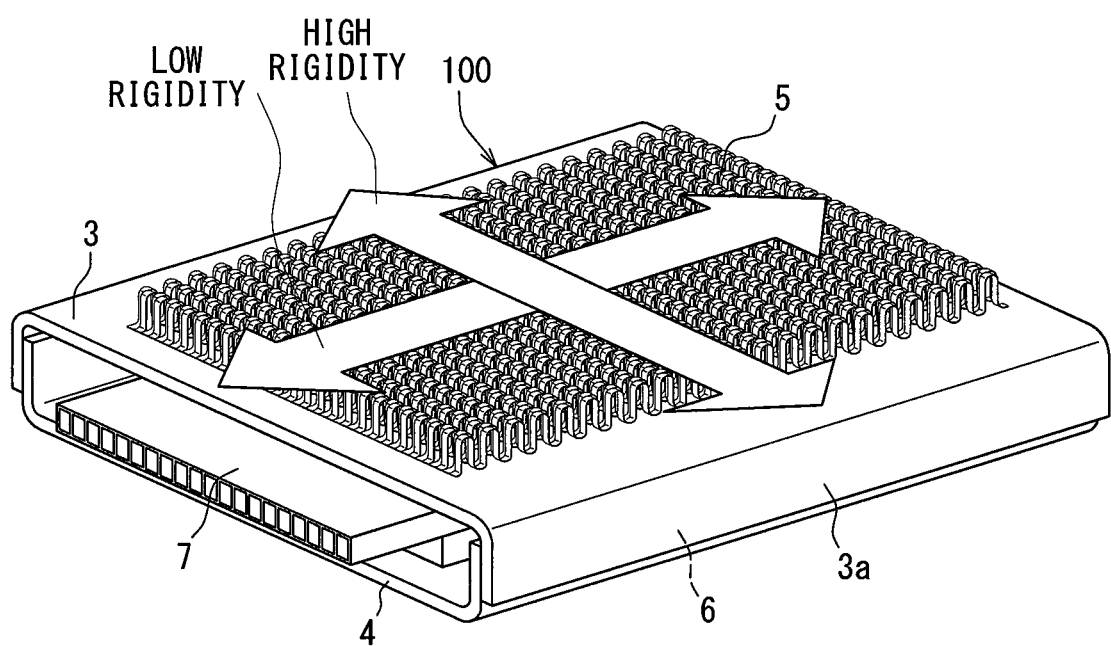
FIG. 5 is a perspective view to illustrate a rigidity of an outside fin of the thermoelectric power generation device in the first embodiment.

FIG. 5 is a perspective view to illustrate a rigidity of each of the outside fins 5, 6. Each of the outside fins 5, 6 is easy to expand or contract and has a low rigidity in a direction to expand in a wavy shape. On the other hand, each of the outside fins 5, 6 is hard to expand or contract and has a high rigidity in a direction orthogonal to the direction.

Further, in FIG. 1, a bending stress is applied to each of the first outside plate 3 and the second outside plate 4 by an effect of the pressing forces shown by the arrows Y11 to Y14. Hence, each of the first outside plate 3 and the second outside plate 4 needs to have a rigidity to resist the bending stress. Hence, each of the first outside plate 3 and the second outside plate 4 preferably has a rigidity increased in a left and right direction orthogonal to the arrows Y11, Y12 of FIG. 1, that is, in a direction to connect the bent portions 3*a*, 4*a*. As is clear from FIG. 3 and FIG. 4, the direction to connect the bent portions 3*a*, 4*a* is a direction shown by the arrow Y31 in which the high-temperature fluid flows. Therefore, as shown in FIG. 5, each of the outside fins 5, 6 has a rigidity increased in the direction shown by the arrow Y31 in which the high-temperature fluid flows and has the rigidity decreased in a is direction orthogonal to the direction.

Figure 6:
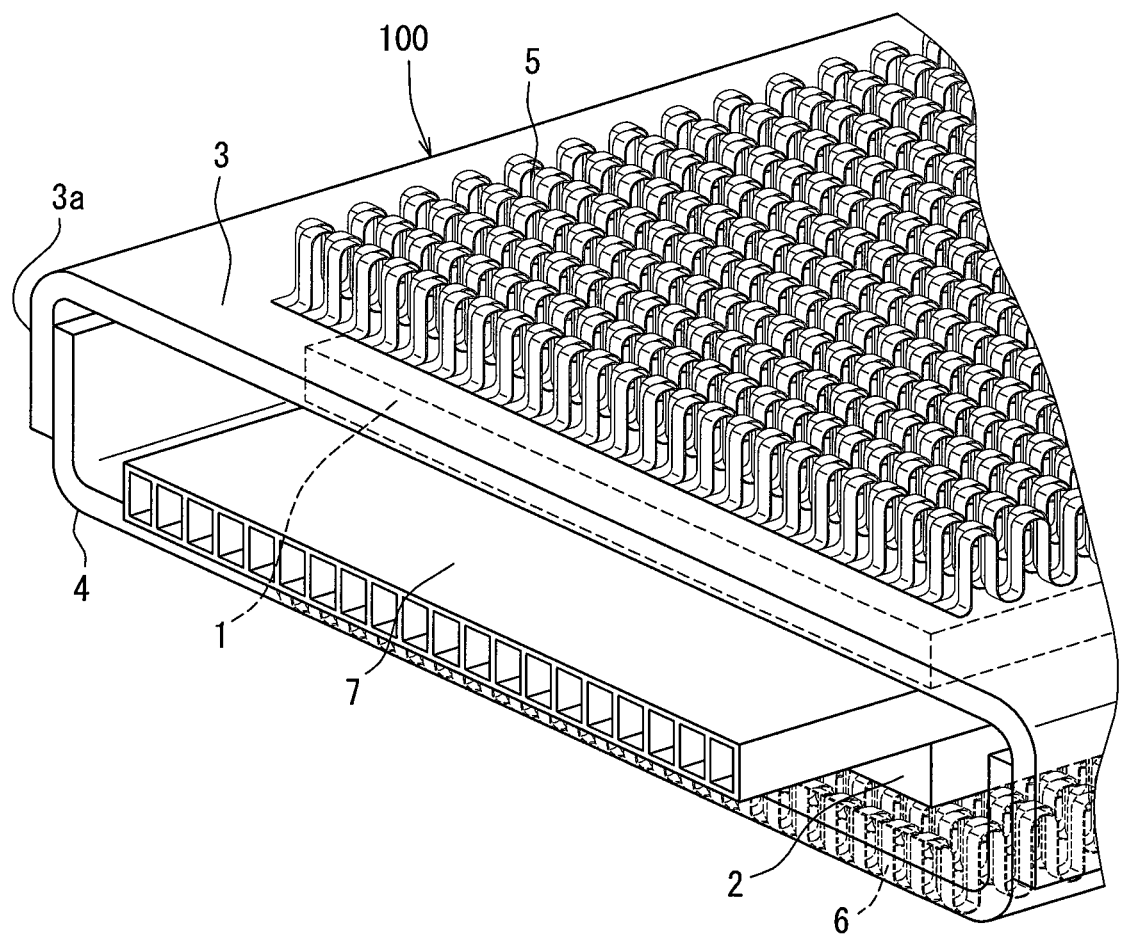
FIG. 6 is an enlarged view of a part of the outside fin of the thermoelectric power generation device in the first embodiment.

FIG. 6 is an enlarged view of a portion of the outside fin 5. The outside fin 5 bent in a wavy shape has a low rigidity in a direction in which waves travel and has a high rigidity in a direction in which waves overlap. When the outside fin 5 is brazed to the first outside plate 3, the rigidity of the first outside plate 3 is also made high. As a result, gaps to impair a heat transfer are hard to be made between the first outside plate 3, the second outside plate 4, and the power generation modules 1, 2. In FIG. 6, offset fins in which positions of adjacent fins are divided in such a way to be slightly offset from each other are employed as the outside fins 5, 6.

In this regard, a heat conducting member such as a graphite sheet may be sandwiched in the pressure contact portions in which the gaps are likely to be made. When the heat conducting member like this is provided in the pressure contact portions, the heat conducting member can absorb small height differences or small recesses and projections, which cause the gaps in the pressure contact portions, and hence can keep a thermal conductivity.

Operations and effects of the first embodiment will be described. The first embodiment includes: the duct 7 in which the low-temperature fluid flows and which has the flat obverse and reverse outside surfaces; and the power generation modules 1, 2 which are brought into contact with the outside surfaces of the duct 7 in such a way as to sandwich the duct 7 and in which thermoelectric power generation elements are received. Further, the first outside plate 3 and the second outside plate 4 are respectively brought into contact with the outsides, which are sides opposite to the duct 7, of the power generation modules 1, 2. Still further, the outside fins 5, 6 are respectively joined to the outsides, which are sides opposite to the power generation modules 1, 2, of the first outside plate 3 and the second outside plate 4.

The first outside plate 3 and the second outside plate 4 have the bent portions 3a, 4a, which are welded to each other in a resiliently deformed state in such a way as to come close to each other, on both their ends in a direction orthogonal to the direction in which the low-temperature fluid flows. A stress to press the power generation modules 1, 2 onto the duct 7 is generated by welding these bent portions 3a, 4a to each other.

The stress to press the power generation modules 1, 2 onto the duct 7 is generated and kept by welding these bent portions 3a, 4a to each other. Hence, close contacts between the power generation module 1 and the first outside plate 3 and between the power generation module 2 and the second outside plate 4 and between the power generation modules 1, 2 and the duct 7 are improved and hence a power generation performance is improved. Further, the welding is used to secure and keep the close contacts and hence a fastening member such as a bolt is not required. Hence, a heat capacity which does not contribute to a heat exchange performance is not increased. As a result, a decrease in a transfer amount of heat and a decrease in a power generation amount are not caused at an initial stage of operation of the thermoelectric power generation device. Therefore, a sufficient performance can be obtained.

In the first embodiment, the bent portions 3a, 4a are linearly welded to each other in a pressed state by the seam welding or the laser welding. Hence, a stress to sandwich the power generation modules 1, 2 is applied to the outside plates 3, 4, whereby the power generation modules 1, 2 are brought into close contact with the outside plates 3, 4 and the duct 7. Further, the pressing force is applied between the duct 7 and the power generation modules 1, 2 and between the power generation modules 1, 2 and the outside plates 3, 4 to thereby form the good pressure contact portions between these.

Figure 21:
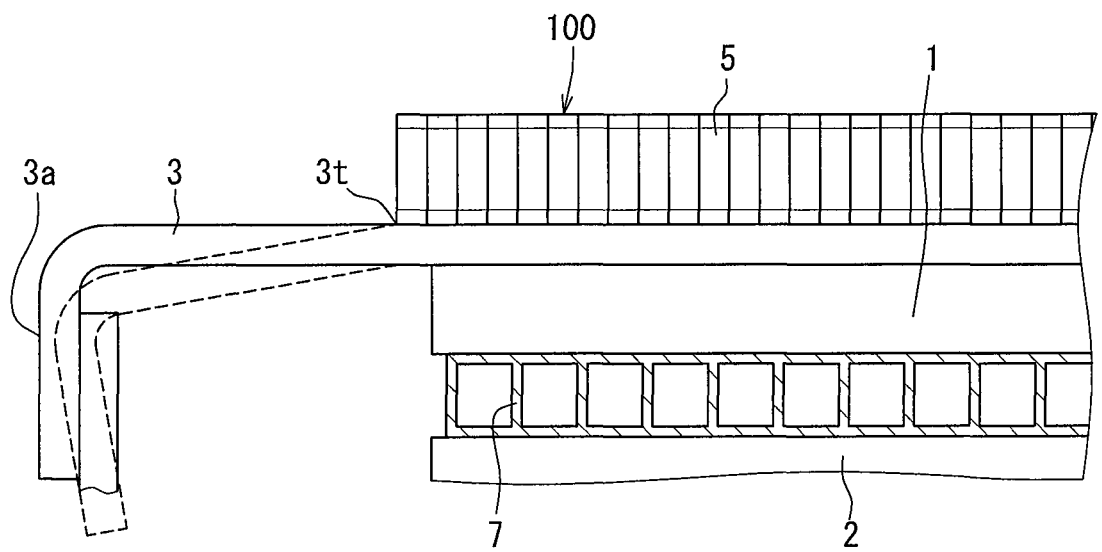
FIG. 21 is an illustration to show a state in which a first outside plate is pressed and deformed in a process of the method for manufacturing a thermoelectric power generation device shown in FIG. 20.

In the first embodiment, as shown in FIG. 21 which will be described later, each of the first outside plate 3 and the second outside plate 4 is bent at an end portion 3t of each of the power generation modules 1, 2 or on the outside of the end portion 3t, thereby being resiliently deformed. According to this, the end portions 3t can keep the flat pressure contact portions and can improve the close contacts between the power generation modules 1, 2 and the first outside plat 3 and the second outside plate 4 and the duct 7 by reaction forces by which the resiliently deformed first outside plate 3 and the second outside plate 4 try to return to their original shapes before deformation.

In the first embodiment, the bent portions 3a, 4a are welded to each other in such a way as to have a welded portion 34 extending along the direction in which the low-temperature fluid flows by the seam welding or the laser welding. According to this, the bent portions 3a, 4a can be firmly welded to each other. In this regard, an end surface 3b of the bent portion 3a may be welded to the bent portion 4a.

In the first embodiment, the internal space 30 sandwiched by the first outside plate 3 and the second outside plate 4 is formed by welding the bent portions 3a, 4a to each other, and the power generation modules 1, 2 are received in the internal space 30. Further, in the first embodiment, the high-temperature fluid smoothes the outside fins 5, 6 and flows in the direction orthogonal to the direction in which the low-temperature fluid flows. Hence, in the outside fins 5, 6, the high-temperature fluid flows in the direction intersecting the direction in which the low-temperature fluid flows. The outside fins 5, 6 are constructed of a plurality of wavy portions. The plurality of wavy portions, as shown in FIG. 6, have a direction in which the waves travel in parallel to a direction shown by an arrow Y61 in which the low-temperature fluid flows and have a direction in which the waves overlap in parallel to a direction shown by an arrow Y62 in which the high-temperature fluid flows. Hence, in the plurality of wavy portions, the direction in which the waves travel is parallel to the direction in which the low-temperature fluid flows. Further, in the plurality of wavy portions, the direction in which the waves travel may intersect the direction in which the low-temperature fluid flows.

According to this, the high-temperature fluid can easily flow between the waves and the outside fins 5, 6 can strengthen a rigidity of the thermoelectric power generation device in the direction in which the high-temperature fluid flows. As a result, the outside plate 3 and the second outside plate 4 to which the outside fins 5, 6 are joined can also strengthen the rigidity of the thermoelectric power generation device in the direction in which the high-temperature fluid flows. On the other hand, the first outside plate 3 and the second outside plate 4 have the bent portions 3a, 4a, which are welded to each other in such a way as to come close to each other, at both ends in the direction in which the high-temperature fluid flows. The stress to press the power generation modules 1, 2 onto the duct 7 is generated by welding the bent portions 3a, 4a to each other. Hence, the rigidity of the thermoelectric power generation device to the stress can be strengthened by the outside fins 5, 6 and hence the close contacts between the power generation modules 1, 2 and the first outside plate 3 and the second outside plate 4 and the duct 7 can be surely kept.

Second Embodiment

Next, a second embodiment will be described. Here, in the second embodiment, the same reference signs as in the first embodiment denote the same constructions as in the first embodiment and the preceding descriptions will be used therefor.

Figure 7:
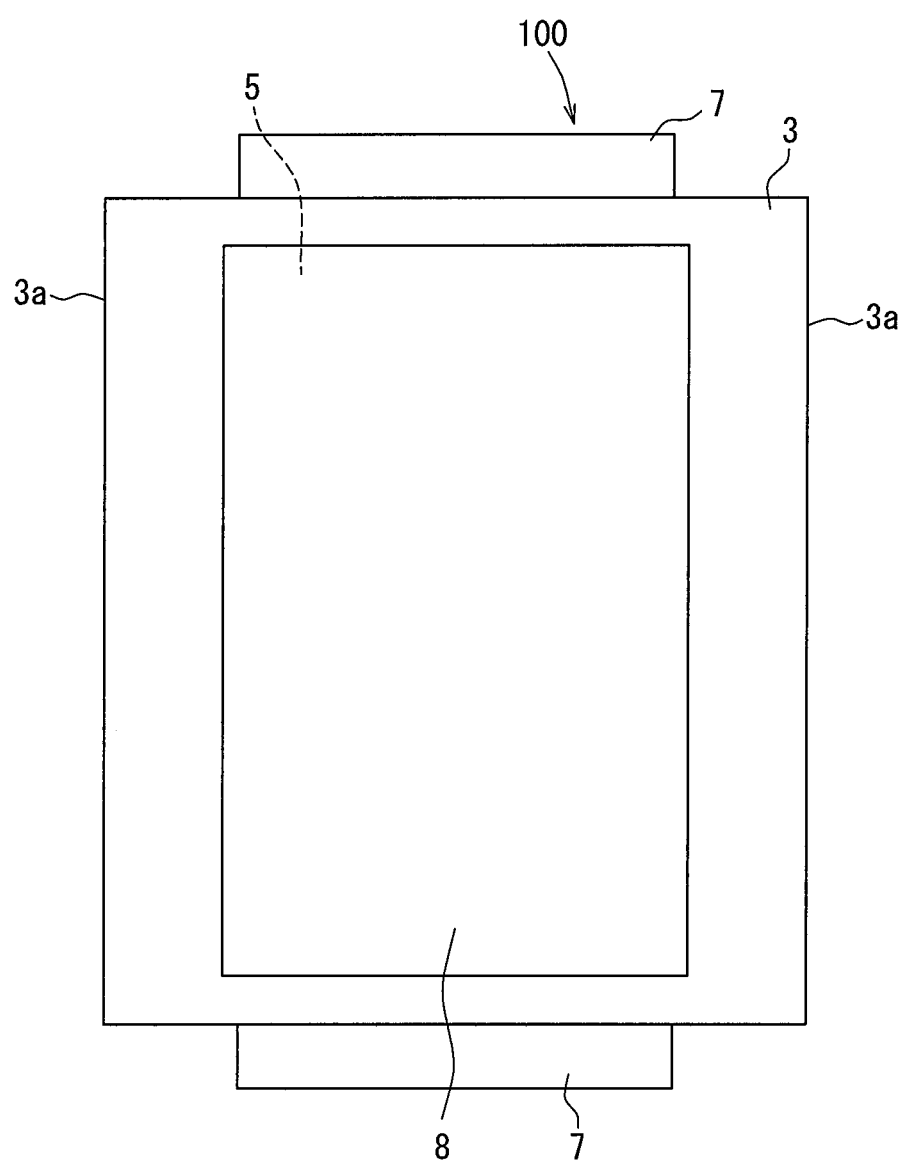
FIG. 7 is a plan view of a thermoelectric power generation device in a second embodiment.
Figure 8:
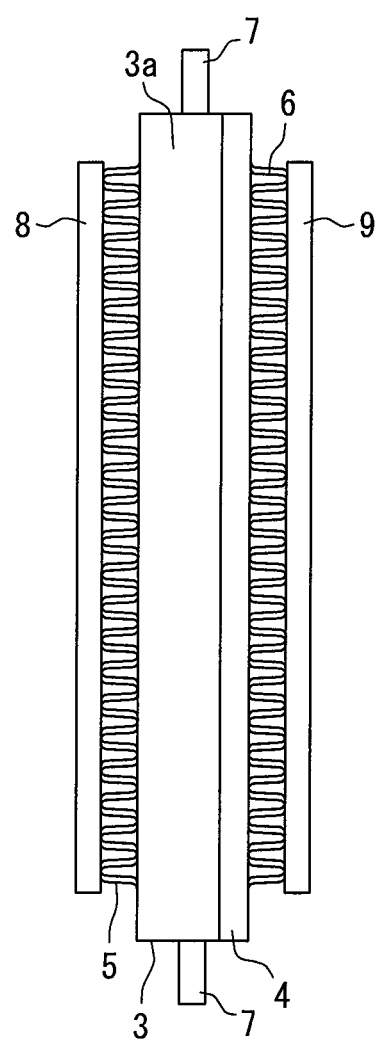
FIG. 8 is a right side view of the thermoelectric power generation device in the second embodiment.

FIG. 7 is a plan view of a thermoelectric power generation device to show the second embodiment. FIG. 8 shows a right side view of the thermoelectric power generation device. As shown in FIG. 8, in the second embodiment, plate-shaped rigidity reinforcing members 8, 9 are attached to the outsides, which are sides opposite to the outside plates 3, 4, of the respective left and right outside fins 5, 6. A material of the plate-shaped rigidity reinforcing members 8, 9 is metal or ceramic. The plate-shaped rigidity reinforcing members 8, 9 and the outside fins 5, 6 are glued together or joined together by brazing. In this way, the outside fins 5, 6 and the first outside plate 3 and the second outside plate 4 can be strengthened in rigidity. In particular, in a case where the outside fins 5, 6 are offset fins, as shown in FIG. 6, in which adjacent fins are divided from each other in such a way as to be offset in position from each other, there is produced a great merit of strengthening the rigidity of the offset fin. The offset fin itself is publicly known and is excellent in a heat exchange performance. In this regard, the outside fins 5, 6 are not limited to the offset fins. Wavy fins in which adjacent fins are not offset from each other can be also employed as the outside fins 5, 6.

Operations and effects of the second embodiment will be described. According to the second embodiment, the outside fin 5 has the plate-shaped rigidity reinforcing member 8 joined to a side thereof, which is a side opposite to the first outside plate 3, and the outside fin 6 has the plate-shaped rigidity reinforcing member 9 joined to a side thereof, which is a side opposite to the second outside plate 4. In other words, the plate-shaped rigidity reinforcing members 8, 9 are joined respectively to the outsides, which are the side opposite to the first outside plate 3 and the side opposite to the second outside plate 4, of the outside fins 5, 6. According to this, the first outside plate 3 and the second outside plate 4 can be strengthened in rigidity in the direction in which the high-temperature fluid flows. On the other hand, the first outside plate 3 and the second outside plate 4 have the bent portions 3a, 4a, which are welded to each other in such a way as to come close to each other, on both their ends in the direction in which the high-temperature fluid flows. A stress to press the power generation modules 1, 2 onto the duct 7, the first outside plate 3, and the second outside plate 4 is generated by welding the bent portions 3a, 4a to each other. Hence, the rigidity of each of the first outside plate 3 and the second outside plate 4 to the stress can be strengthened by each of the plate-shaped rigidity reinforcing members 8, 9 and hence the close contacts between the power generation modules 1, 2 and the first outside plate 3 and the second outside plate 4 and the duct 7 can be surely kept.

Third Embodiment

Figure 9:
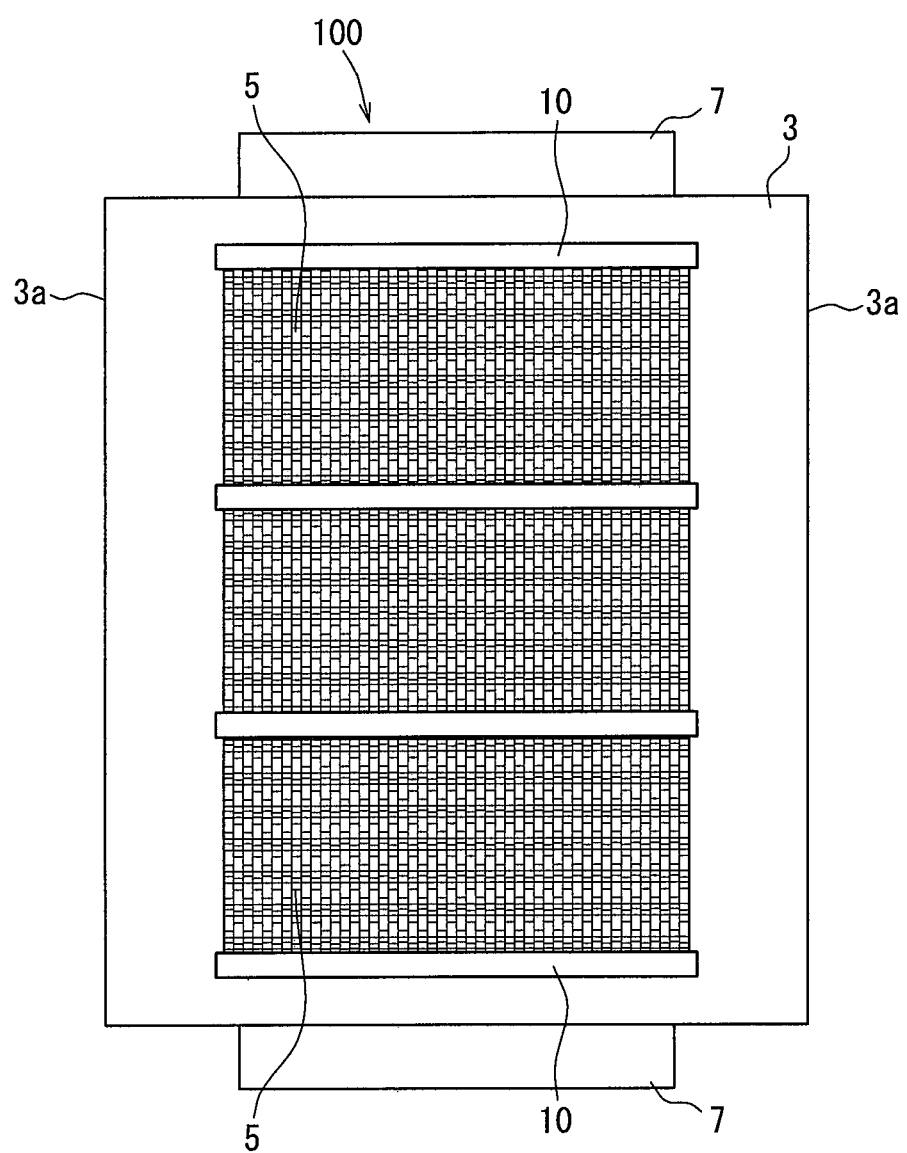
FIG. 9 is a plan view of a thermoelectric power generation device in a third embodiment.
Figure 10:
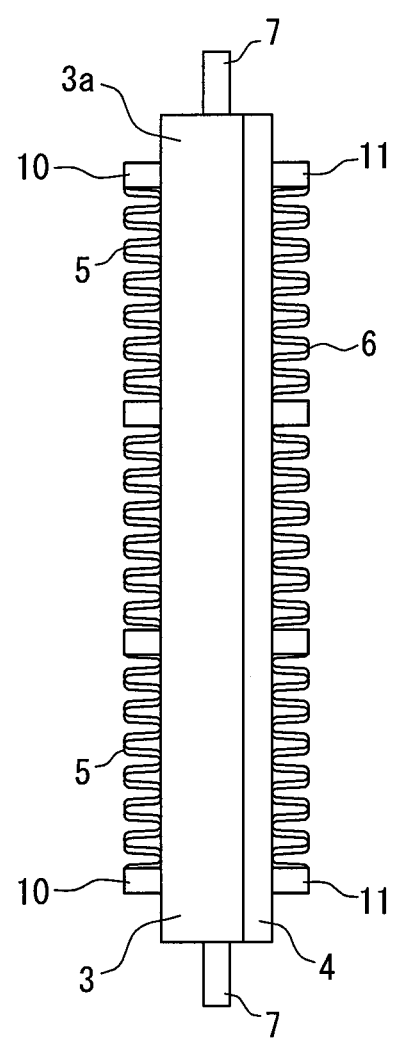
FIG. 10 is a right side view of the thermoelectric power generation device in the third embodiment.
Figure 11:
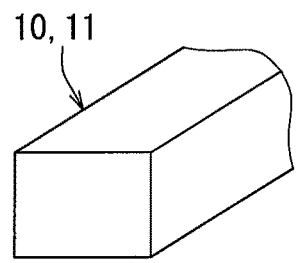
FIG. 11 is a perspective view of a bar-shaped rigidity reinforcing member in a case where the bar-shaped rigidity reinforcing member has a cross section formed in a rectangular shape in the third embodiment.
Figure 12:
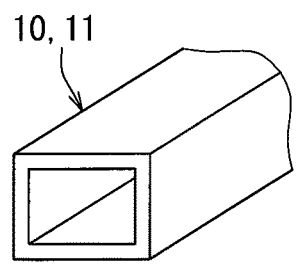
FIG. 12 is a perspective view of a bar-shaped rigidity reinforcing member in a case where the bar-shaped rigidity reinforcing member is formed in a shape of a rectangular pipe in a modification of the third embodiment.
Figure 13:
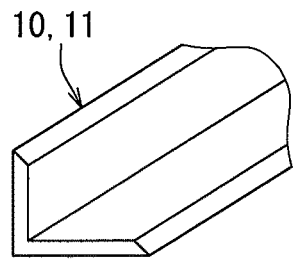
FIG. 13 is a perspective view of a bar-shaped rigidity reinforcing member in a case where the bar-shaped rigidity reinforcing member is formed in a shape of an angle in a modification of the third embodiment.
Figure 14:
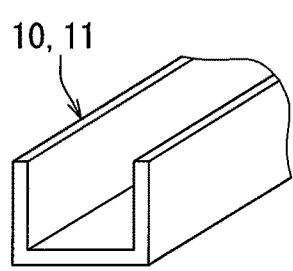
FIG. 14 is a perspective view of a bar-shaped rigidity reinforcing member in a case where the bar-shaped rigidity reinforcing member is formed in a shape of a channel whose cross section is shaped like a letter U in a modification of the third embodiment.

Next, a third embodiment will be described. Portions different from those in the above embodiments will be described. In FIG. 9 and FIG. 10, as an example, a total of 8 bar-shaped rigidity reinforcing members 10, 11 are inserted into the outside fins 5, 6 positioned on the outsides of the first outside plate 3 and the second outside plate 4, in other words, in such a way as to mix with the outside fins 5, 6. As the bar-shaped rigidity reinforcing members 10, 11, metal bars each having a rectangular cross section as shown in FIG. 11 are used. However, metal bars each of which is formed in a shape of a rectangular pipe as shown in FIG. 12, an angle as shown in FIG. 13, or a channel having a cross section shaped like a letter U as shown in FIG. 14 can be employed as the rigidity reinforcing members 10, 11. A direction in which the bar-shaped rigidity reinforcing members 10, 11 are extended is parallel to the direction in which the high-temperature fluid flows, so the bar-shaped rigidity reinforcing members 10, 11 hardly disturb a flow of the high-temperature fluid. The divided outside fins 5, 6 are arranged between the bar-shaped rigidity reinforcing members 10, 11. The bar-shaped rigidity reinforcing members 10, 11 are brazed to the outside fins 5, 6 and the first outside plate 3 and the second outside plate 4.

Operations and effects of the third embodiment will be described. According to the third embodiment, the plurality of bar-shaped rigidity reinforcing members 10, 11, which are extended in parallel to the direction in which the high-temperature fluid flows in a state mixed with the outside fins 5, 6, are joined to the outside fins 5, 6 and the first outside plate 3 and the second outside plate 4.

According to this, the rigidity of each of the first outside plate 3 and the second outside plate 4 in the direction in which the high-temperature fluid flows can be strengthened. On the other hand, the first outside plate 3 and the second outside plate 4 have the bent portions 3a, 4a, which are welded to each other in such a way as to come close to each other, on both their ends in the direction in which the high-temperature fluid flows. A stress to press the power generation modules 1, 2 onto the duct 7, the first outside plate 3, and the second outside plate 4 is generated by welding the bent portions 3a, 4a to each other.

Fourth Embodiment

Figure 15:
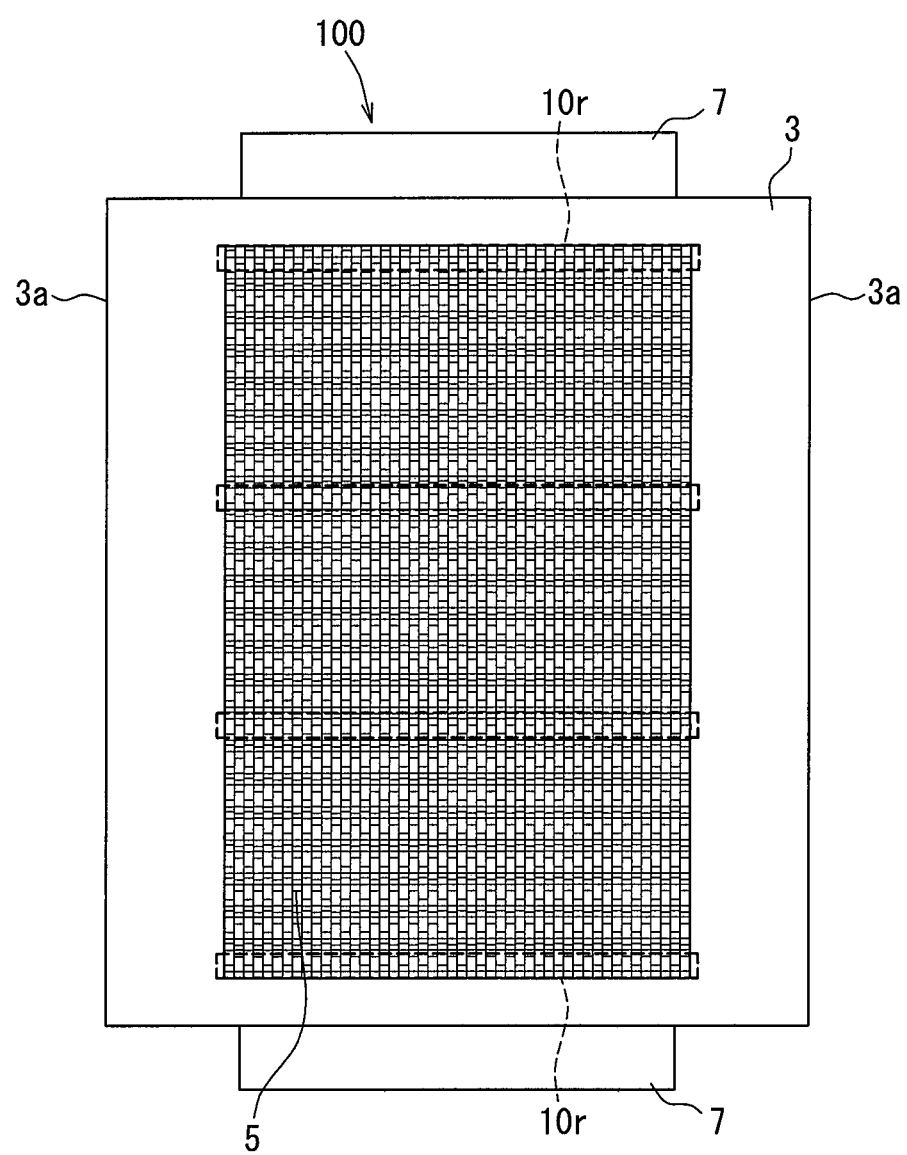
FIG. 15 is a plan view of a thermoelectric power generation device in a fourth embodiment.
Figure 16:
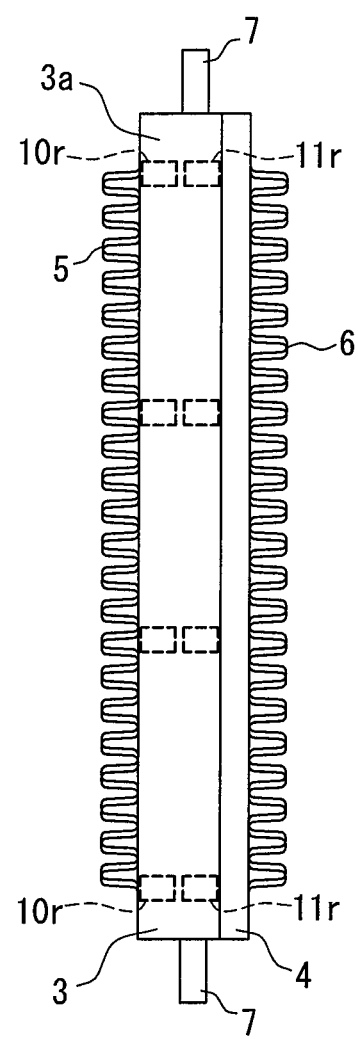
FIG. 16 is a right side view of the thermoelectric power generation device in the fourth embodiment.

Next, a fourth embodiment will be described. In the third embodiment shown in FIG. 9 and FIG. 10, the bar-shaped rigidity reinforcing members 10, 11 are arranged between the outside fins 5, 6, which hence reduces an area in which the outside fins 5, 6 are arranged. In consideration of this problem, in the fourth embodiment, as shown in FIG. 15 and FIG. 16, inside rigidity reinforcing members 10r, 11r are set in the inside of the outside fins 5, 6. The inside rigidity reinforcing members 10r, 11r are joined to the first outside plate 3 and the second outside plate 4. Further, the inside rigidity reinforcing members 10r, 11r are interposed respectively between the first outside plate 3 and the power generation module 1 and between the second outside plate 4 and the power generation module 2. However, in this arrangement, the inside rigidity reinforcing members 10r, 11r interfere with the first outside plate 3 and the second outside plate 4 or the power generation modules 1, 2.

For that reason, a receiving groove which receives at least a part of the inside rigidity reinforcing members 10r, 11r may be formed in the first outside plate 3 and the second outside plate 4 or in the power generation modules 1, 2. Further, when the power generation modules 1, 2 are constructed of a plurality of power generation modules arranged with a specified space left therebetween, divided portions 13 can be formed in the power generation modules 1, 2. In order to avoid the inside rigidity reinforcing members 10r, 11r from interfering with the power generation modules 1, 2, the divided portions 13 can be used to receive at least a part of the inside rigidity reinforcing members 10r, 11r.

Figure 17:
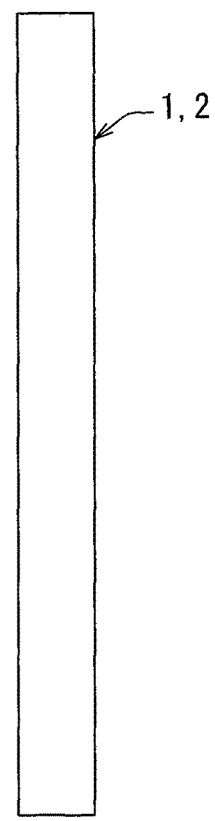
FIG. 17 is an illustration to show an external appearance of a power generation module which becomes a comparative example to the fourth embodiment.
Figure 18:
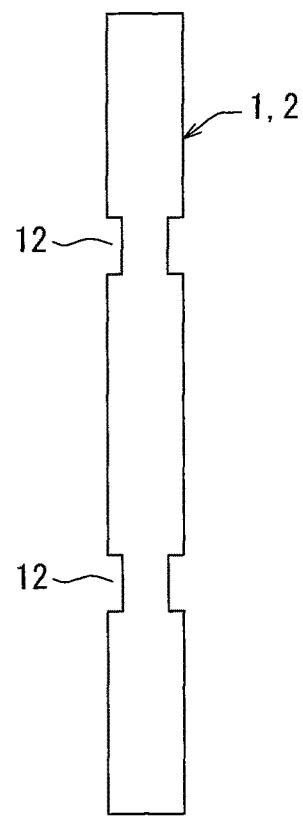
FIG. 18 is an illustration to show an external appearance of a power generation module in which a receiving groove is formed in the fourth embodiment.
Figure 19:
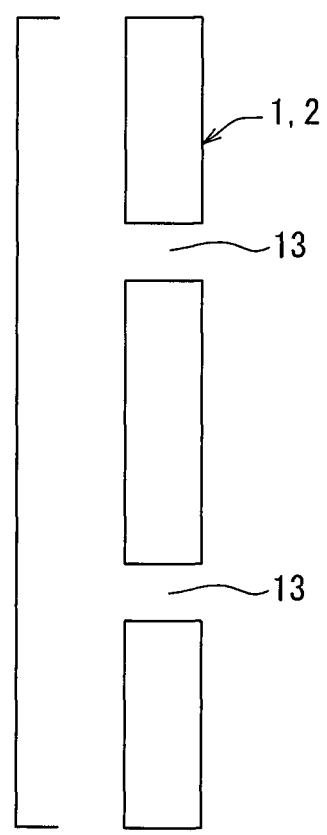
FIG. 19 is an illustration to show an external appearance of a power generation module in which a divided portion is formed in a modification of the fourth embodiment.

Hereinafter, this will be described. In the first embodiment, as shown in FIG. 17, the power generation modules 1, 2 formed of a box having a square end surface are employed. In comparison with this, in the fourth embodiment, as shown in FIG. 18, the power generation modules 1, 2 are provided with receiving grooves 12 to receive at least a part of the inside rigidity reinforcing members 10r, 11r. As shown in FIG. 19, the power generation modules 1, 2 are constructed of a plurality of power generation modules arranged with a specified space of the divided portions 13 left therebetween. The divided portions 13 can receive a part of the inside rigidity reinforcing members 10r, 11r. In this way, the inside rigidity reinforcing members 10r, 11r can avoid interfering with the first outside plate 3 and the second outside plate 4 or the power generation modules 1, 2.

Operations and effects of the fourth embodiment will be described. According to the fourth embodiment, the plurality of inside rigidity reinforcing members 10r, 11r, which are extended in parallel to the direction in which the high-temperature fluid flows, are joined to the first outside plate 3 and the second outside plate 4 between the first outside plate 3 and the second outside plate 4 and the power generation modules 1, 2. According to this, the rigidity of the first outside plate 3 and the rigidity of the second outside plate 4 can be made higher, so that a rigidity to a stress can be made higher and hence the close contacts between the power generation modules 1, 2 and the first outside plate 3 and the second outside plate 4 and the duct 7 can be surely kept.

According to the fourth embodiment, the receiving grooves 12 or the divided portions 13 to receive the inside rigidity reinforcing members 10r, 11r are formed in the power generation modules 1, 2. According to this, the inside rigidity reinforcing members 10r, 11r can be received between the first outside plate 3 and the second outside plate 4 and the power generation modules 1, 2 in such a way as to avoid interference.

Figure 20:
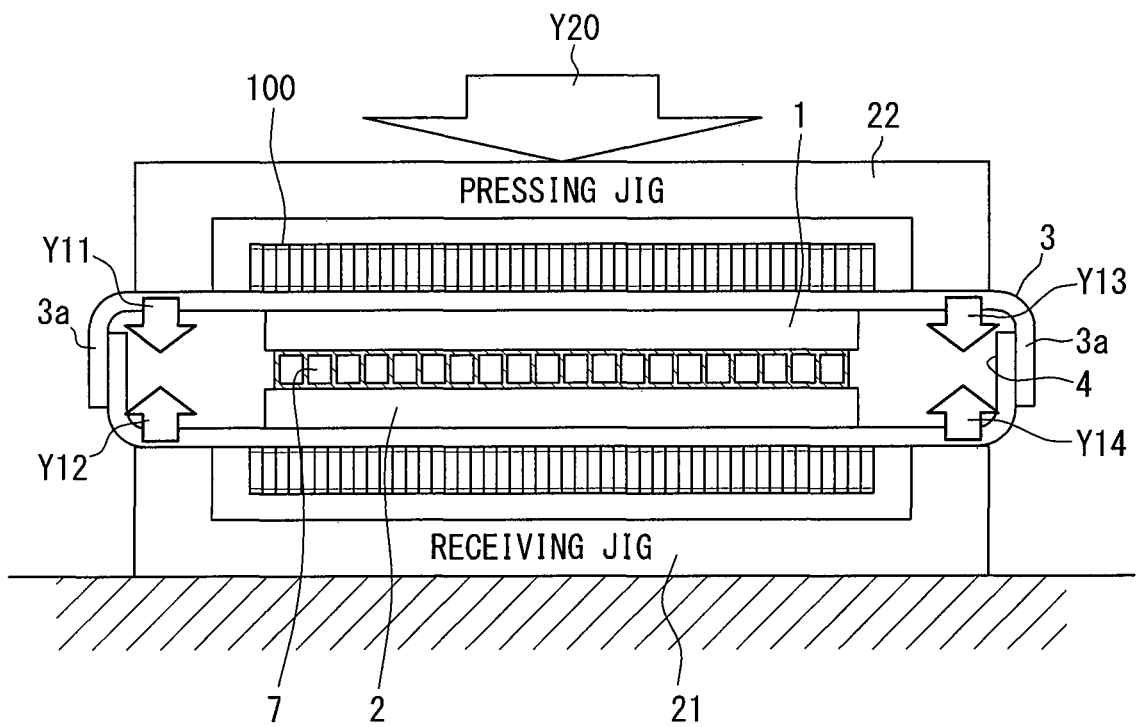
FIG. 20 is an illustration to show an example of a method for manufacturing a thermoelectric power generation device in the first to the fourth embodiments.

Hereinafter, a method for manufacturing a power generation device, which is generally common to the first embodiment to the fourth embodiment, will be described, as a matter of convenience, by the use of the first embodiment. As shown in FIG. 20, the first outside plate 3 and the second outside plate 4 are combined with each other and are set between a receiving jig 21 and a pressing jig 22 of a pressing device. Then, a pressure is applied to these jigs 21, 22 as shown by an arrow Y20 by a press. In this way, the bent portions 3a, 4a are pressed as shown by the arrows Y11 to Y14 in such a way that their overlapping portions are increased. As shown in FIG. 21, the first outside plate 3 or the second outside plate 4 are bent at the end portions 3t of the power generation modules 1, 2 and are resiliently deformed, and the bent portions 3a, 4a are welded to each other in a pressed state by a welding machine. Hence, the first outside plate 3 and the second outside plate 4 are joined together with a stress to sandwich the power generation modules 1, 2 applied thereto. In this way, the power generation modules 1, 2 try to bring the first outside plate 3 and the second outside plate 4 into close contact with the duct 7. Further, the pressing forces shown by the arrows Y11 to Y14 are applied between the duct 7 and the power generation modules 1, 2 and between the power generation modules 1, 2 and the first outside plate 3 and the second outside plate 4 to thereby form the excellent pressure contact portions. In this regard, the above method for manufacturing a power generation device can be applied also to a modification of the embodiment.

Operations and effects of the manufacturing method will be described. The above method for manufacturing a power generation device can be applied to a thermoelectric power generation device including: the duct 7 in which the low-temperature fluid flows; the power generation modules 1, 2 which are brought into contact with the duct 7; the first outside plate 3 and the second outside plate 4 which are brought into contact with the outsides of the power generation modules 1, 2, respectively.

At the time of manufacturing the thermoelectric power generation device, the above method includes an arranging step of arranging the power generation modules 1, 2 and the duct 7 between the first outside plate 3 and the second outside plate 4. Next, the method includes a pressing step of pressing the first outside plate 3 and the second outside plate 4 in such a way that the first outside plate 3 and the second outside plate 4 come near to each other to thereby generate a stress to press the first outside plate 3 and the second outside plate 4 onto the power generation modules 1, 2. Further, the method includes a welding step of welding the first outside plate 3 to the second outside plate 4 while generating the stress to thereby keep a pressing state.

According to this method, the first outside plate 3 and the second outside plate 4 are welded to each other while generating the stress to press the first outside plate 3 and the second outside plate 4 onto the power generation modules 1, 2, so the close contacts between the power generation modules 1, 2 and the outside plates 3, 4 and the duct 7 can be improved. As a result, a power generation performance can be improved. Further, a fastening member such as a bolt for securing and keeping the close contacts is not required and hence a heat capacity which does not contribute to a heat exchange performance is not increased. As a result, the thermoelectric power generation device does not cause a decrease in an amount of heat transfer and a decrease in a power generation amount at an initial stage of an operation and hence can achieve an excellent performance.

Figure 22:
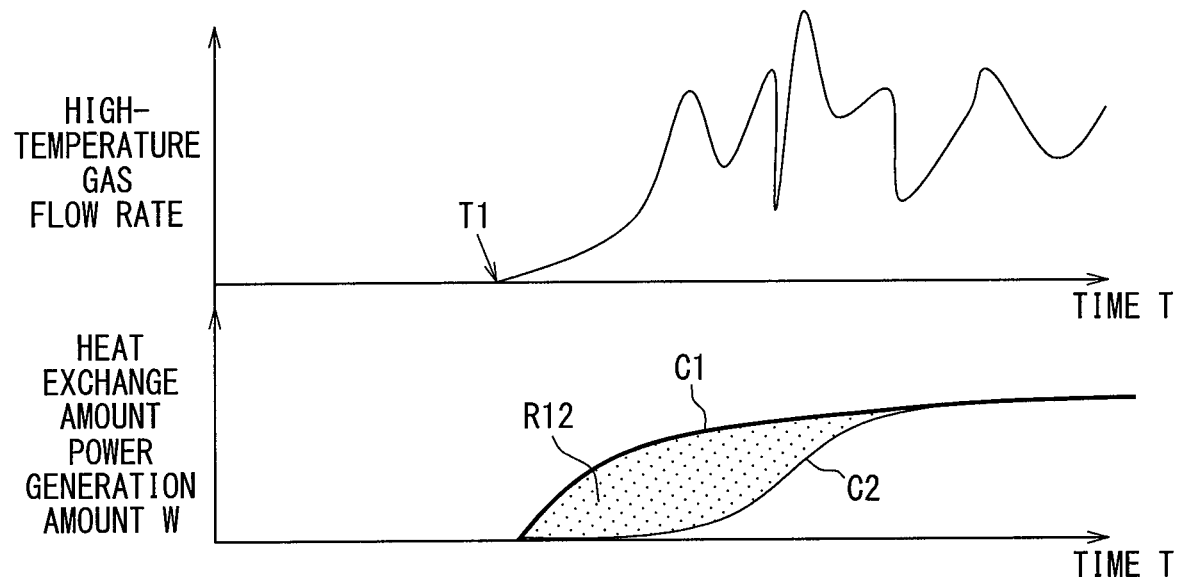
FIG. 22 is a characteristic diagram to show an example of a characteristic common to the thermoelectric power generation devices in the first to the fourth embodiments.

Hereinafter, the excellent performance will be described by the use of FIG. 22. In FIG. 22, a horizontal axis shows a passage of time T and a vertical axis shows a flow rate Q of a high-temperature gas made of an exhaust gas and a heat exchange amount, eventually, a power generation amount W. The high-temperature gas starts to flow into the outside fins 5, 6 at a time T1. Then, a power generation is started and, in a characteristic C1 of the embodiment, the power generation amount W rises up quickly. On the other hand, in a characteristic C2 of a device in a developing stage in which the stress described above is not applied, as a comparative example, the close contacts between the power generation modules 1, 2 and the first outside plate 3 and the second outside plate 4 and the duct 7 are inferior and hence the power generation amount W rises up comparatively slowly. An area of a difference region R12 between the characteristic C1 and the characteristic C2 shows an improvement in performance by the thermoelectric power generation device according to the embodiment.

Fifth Embodiment

Next, a fifth embodiment will be described with reference to FIG. 23 to FIG. 26. In the fifth embodiment, the same reference signs as in the embodiments described above denote the same constructions as in the embodiments and the preceding descriptions will be used therefor.

Figure 23:
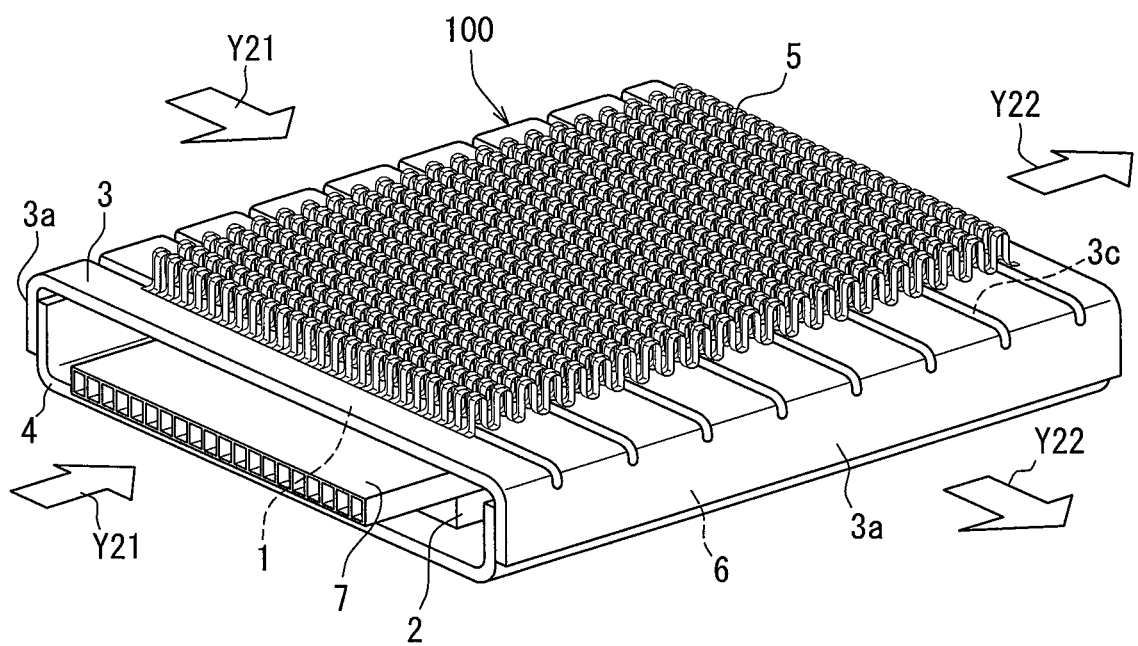
FIG. 23 is a perspective view of a thermoelectric power generation device of a fifth embodiment.
Figure 24:
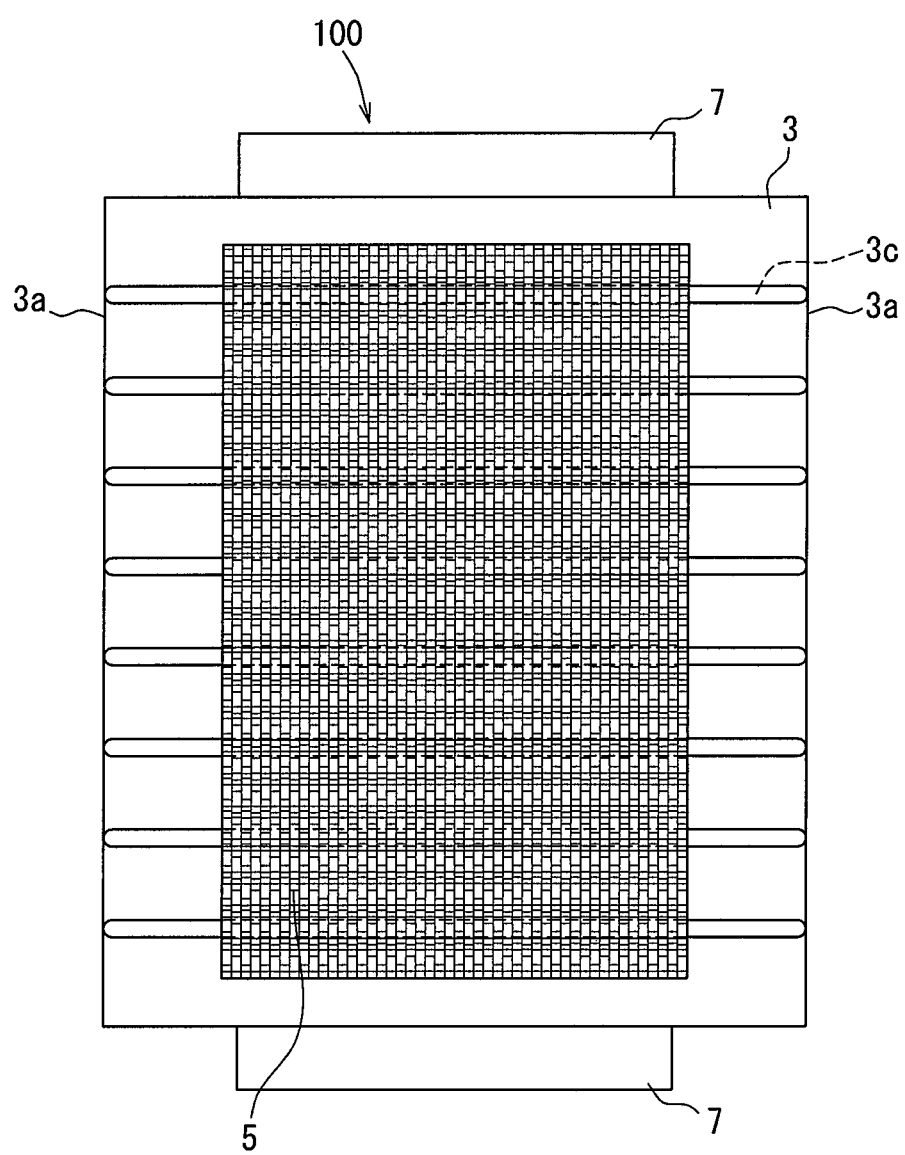
FIG. 24 is a plan view of the thermoelectric power generation device of the fifth embodiment.

As shown in FIG. 23, the first outside plate 3 has ribs 3c on a surface of a duct 7 side, which is a side opposite to the outside fin 5. Each of the ribs 3c is a protruded deformed part in which a surface on the duct 7 side of the first outside plate 3 is deformed in such a way as to protrude. The ribs 3c are reinforcing parts capable of increasing the rigidity of the first outside plate 3. The ribs 3c can be made by pressing the first outside plate 3 from a surface on an outside fin 5 side to the duct 7 side to thereby deform the surface on the duct 7 side of the first outside plate 3 in such a way as to protrude. As shown in FIG. 23 and FIG. 24, the ribs 3c are plurally provided on the first outside plate 3. Each of the ribs 3c is provided in such a way as to extend to the whole length in a direction in which the high-temperature fluid flows on the first outside plate 3. Each of the ribs 3c is extended in such a way as to connect the bent portion 3a and the bent portion 3a at both ends on the first outside plate 3. The plurality of ribs 3c are provided at intervals on the whole length of the outside fin 5 in a direction in which the low-temperature fluid flows on the first outside plate 3.

Figure 25:
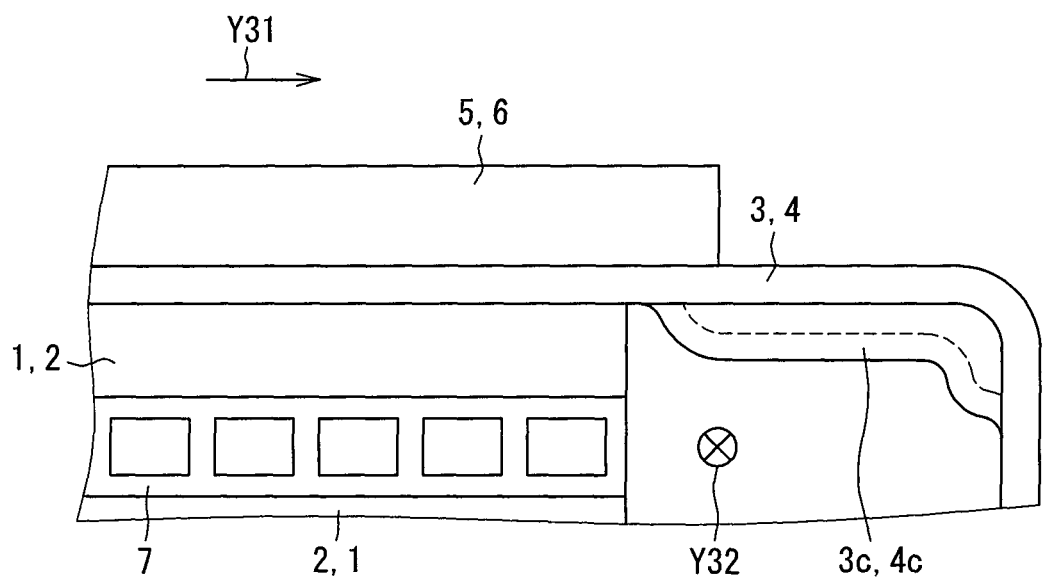
FIG. 25 is a partial side view to show a protruded part of the fifth embodiment.

As shown in FIG. 25, the rib 3c has a portion overlapping at least an end portion of the outside fin 5. According to this construction, when the first outside plate 3 is pressed at the time of manufacturing, a stress applied when the first outside plate 3 is pressed can be dispersed by an overlapping structure of the fins and the rib 3*c*. Hence, it is possible to prevent the rigidity of the first outside plate 3 from being greatly decreased near the end portion of the outside fin 5 and hence to improve a durability of the thermoelectric power generation device 100.

Further, each of the ribs 3*c* is provided over from the portion overlapping the end portion of the outside fin 5 to the bent portion 3*a*. According to this construction, when a spring back is caused after the first outside plate 3 and the second outside plate 4 are welded to each other, an effect of dispersing the stress can be produced. Hence, it is possible to avoid a trouble such that the rigidity of the first outside plate 3 is greatly decreased and hence to improve the durability of the thermoelectric power generation device 100.

Figure 26:
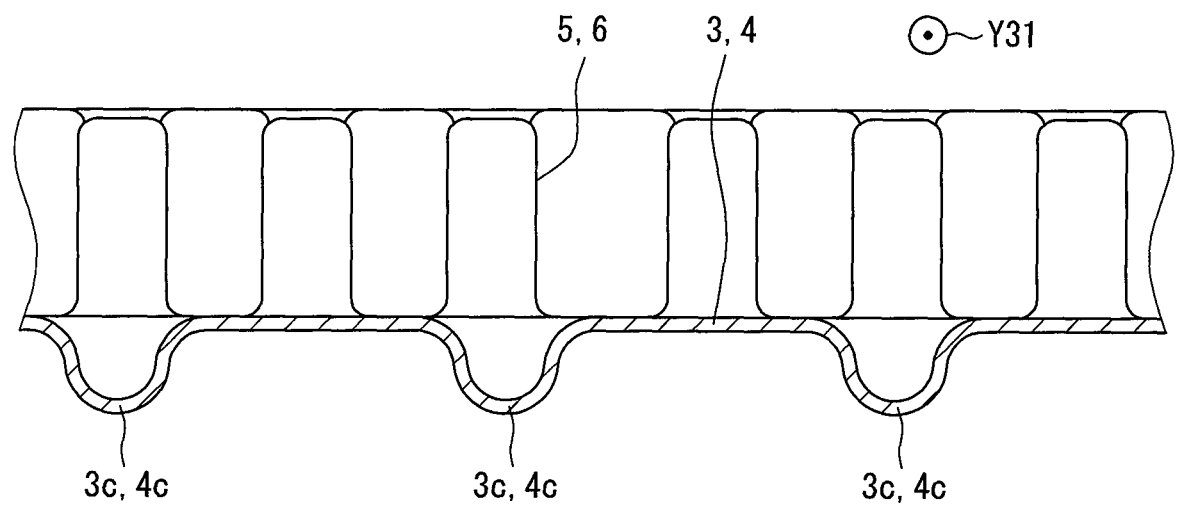
FIG. 26 is a partial cross-sectional view to show the protruded part of the fifth embodiment.

As shown in FIG. 26, the rib 3*c* is arranged at a position avoiding a joined portion in which the first outside plate 3 is joined to the outside fins 5. According this construction, the joined portion in the outside fin 5 joined to the first outside plate 3 can be secured. Hence, an area in which the first outside plate 3 and the outside fins 5 are not brazed to each other can be inhibited in the joined portion of the first outside plate 3 and the outside fins 5, so the rigidity of the first outside plate 3 can be secured. The description related to the rib 3*c* in the first outside plate 3 is the same as the rib 4*c* in the second outside plate 4. In the above descriptions, the first outside plate 3 can be replaced by the second outside plate 4 and the rib 3*c* can be replaced by the rib 4*c*.

Sixth Embodiment

Next, a sixth embodiment will be described with reference to FIG. 27 and FIG. 28. In the sixth embodiment, the same reference signs as in the embodiments described above denote the same constructions as in the embodiments and the preceding descriptions will be used therefor.

In the sixth embodiment, a block-shaped member 103*c* and a block-shaped member 104*c* are different from the rib 3*c* and the rib 4*c* in the fifth embodiment. The block-shaped member 103*c* is a member provided integrally with a surface on a duct 7 side of the first outside plate 3. The block-shaped member 103*c* is a part separate from the first outside plate 3 before being joined to the first outside plate 3. The block-shaped member 103*c* is joined to the first outside plate 3 by brazing or welding, thereby being provided integrally with the first outside plate 3. The block-shaped member 103*c* is a reinforcing part capable of increasing the rigidity of the first outside plate 3.

Figure 27:
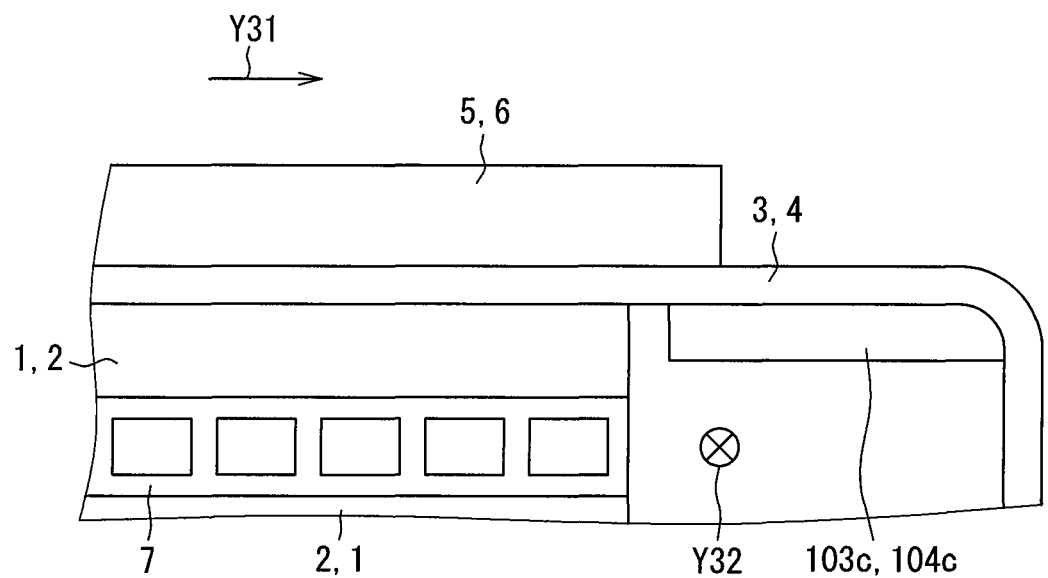
FIG. 27 is a partial side view to show a protruded part of a sixth embodiment.
Figure 28:
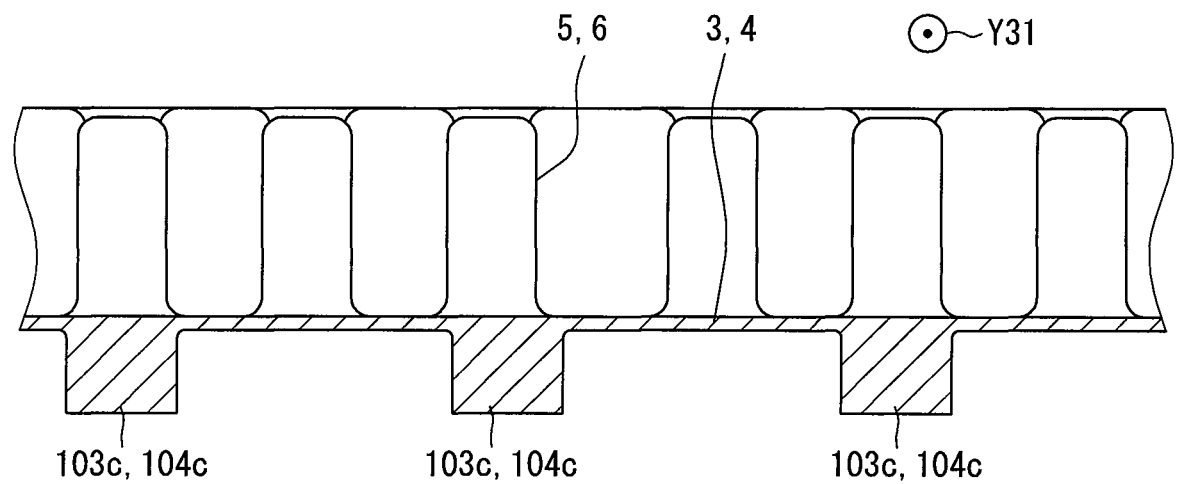
FIG. 28 is a partial cross-sectional view to show the protruded part of the sixth embodiment.

As shown in FIG. 27, the block-shaped member 103*c* has a portion overlapping at least an end portion of the outside fin 5. According to this construction, when the first outside plate 3 is pressed at the time of manufacturing, a stress at the time of pressing the first outside plate 3 can be dispersed by an overlapping structure of the outside fin 5 and the block-shaped member 103*c*. Hence, it is possible to avoid a trouble such that the rigidity of the first outside plate 3 is greatly decreased near the end portion of the outside fin 5 and hence to improve a durability of the thermoelectric power generation device 100. Further, as shown in FIG. 28, the block-shaped member 103*c* is provided at a position to avoid the joined portion of the first outside plate 3 and the outside fin 5.

The block-shaped member 103*c* is provided over from a portion overlapping the end portion of the outside fin 5 to the bent portion 3*a*. According to this construction, when a spring back is caused after the first outside plate 3 is welded to the second outside plate 4, an effect of dispersing a stress is produced. Hence, it is possible to avoid a trouble such that the rigidity of the first outside plate 3 is greatly decreased and hence to improve the durability of the thermoelectric power generation device 100.

Further, the block-shaped member 104*c* has the same construction as the block-shaped member 103*c* described in the sixth embodiment and produces the same operations and effects as described above. In this case, in the operations and effects described in the sixth embodiment, the first outside plate 3 can be replaced by the second outside plate 4.

Seventh Embodiment

Figure 29:
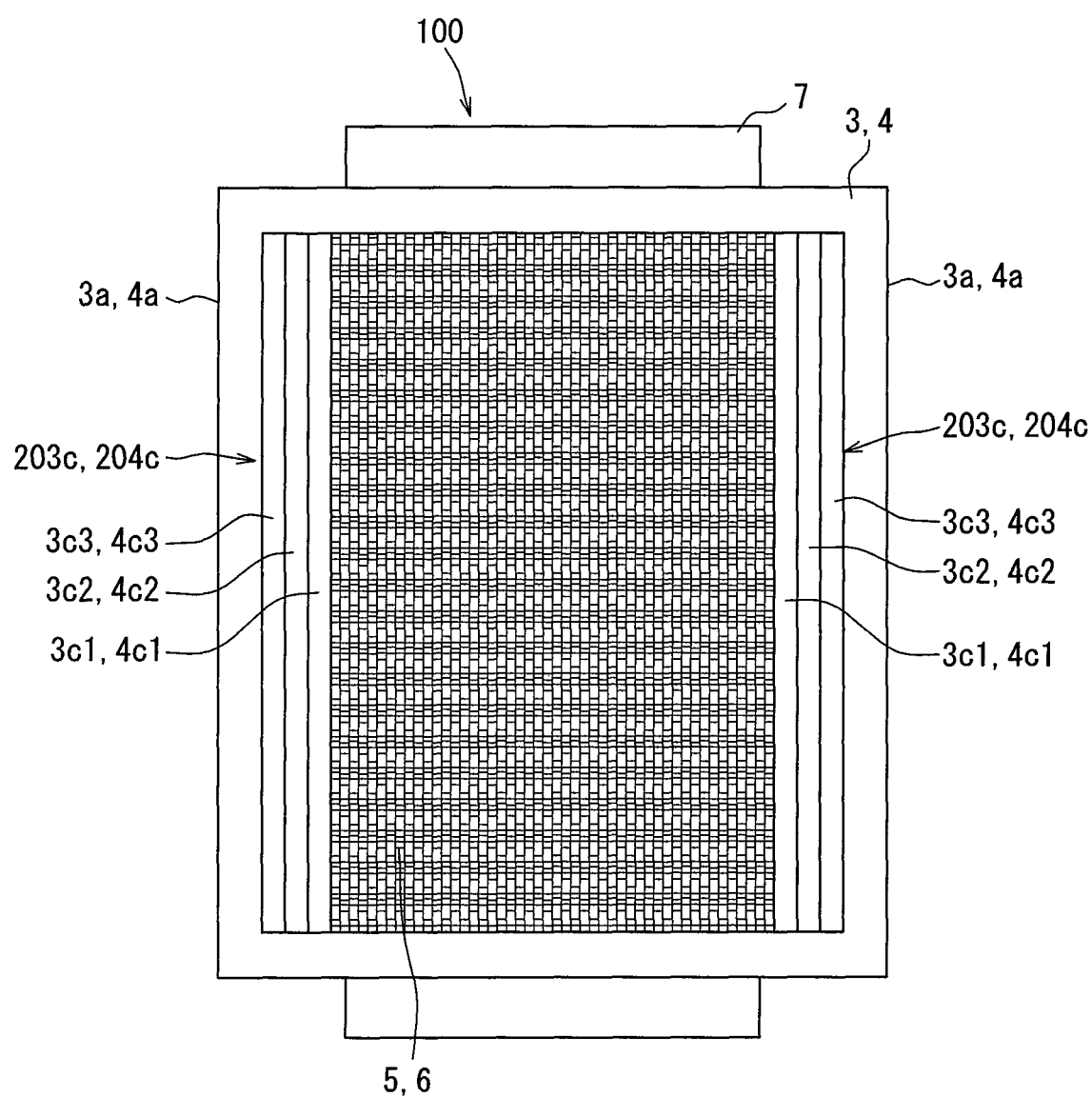
FIG. 29 is a plan view of a thermoelectric power generation device of a seventh embodiment.
Figure 30:
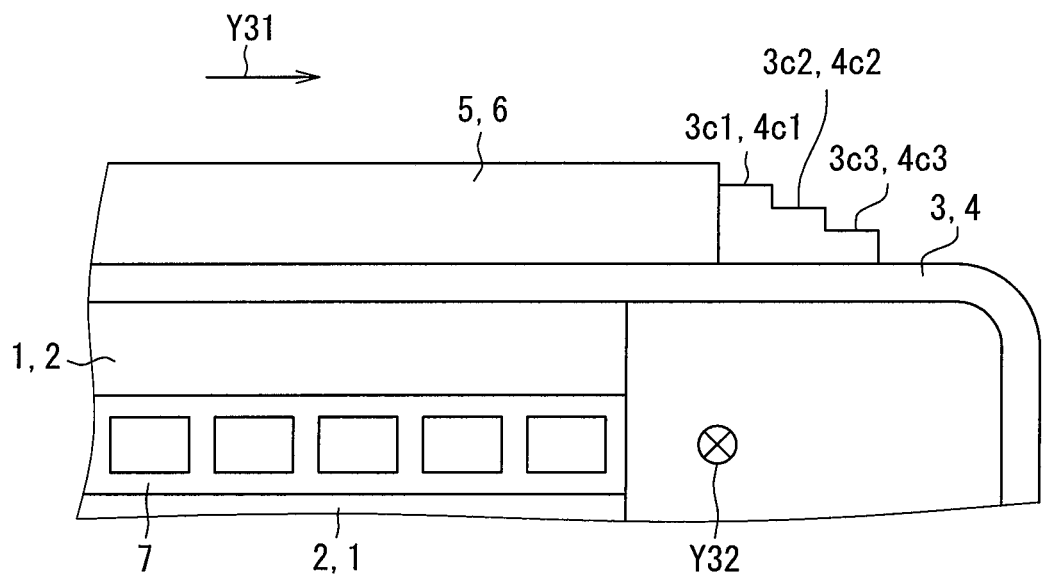
FIG. 30 is a partial side view to show a protruded part of the seventh embodiment.

Next, a seventh embodiment will be described with reference to FIG. 29 to FIG. 31. In the seventh embodiment, the same reference signs as in the embodiments described above denote the same constructions as in the embodiments and the preceding descriptions will be used therefor.

The seventh embodiment is a modification of the reinforcing part described above. As shown in FIG. 29 and FIG. 30, the first outside plate 3 has a rigidity reducing part 203*c*. The rigidity reducing part 203*c* is a part which is provided adjacently to the outside fin 5 and which is lower in the rigidity than the outside fin 5. The rigidity reducing part 203*c* is a part having a simpler construction and a smaller thickness than the outside fin 5. For example, the rigidity reducing part 203*c* can be formed of a fin formed in a shape of a thin plate protruding vertically from the first outside plate 3.

The rigidity reducing part 203*c* can be constructed of a protruding part whose protruding height becomes smaller stepwise as it is separating from the outside fin 5. A protruding part 3*c*1 is closest to the outside fin 5 and is adjacent to the outside fin 5. A protruding part 3*c*2 is adjacent to the protruding part 3*c*1 and is lower in a protruding height than the protruding part 3*c*1 and is separate from the outside fin 5. A protruding part 3*c*3 is adjacent to the protruding part 3*c*2 and is lower in the protruding height than the protruding part 3*c*2 and is separate from the outside fin 5. The description relating to the rigidity reducing part 203*c* in the first outside plate 3 is the same as a rigidity reducing part 204*c* in the second outside plate 4. In the above description, the first outside plate 3 can be replaced by the second outside plate 4, the rigidity reducing part 203*c* can be replaced by the rigidity reducing part 204*c*, and the protruding part 3*c*1, the protruding part 3*c*2, and the protruding part 3*c*3 can be replaced by a protruding part 4*c*1, a protruding part 4*c*2, and a protruding part 4*c*3, respectively.

Figure 31:
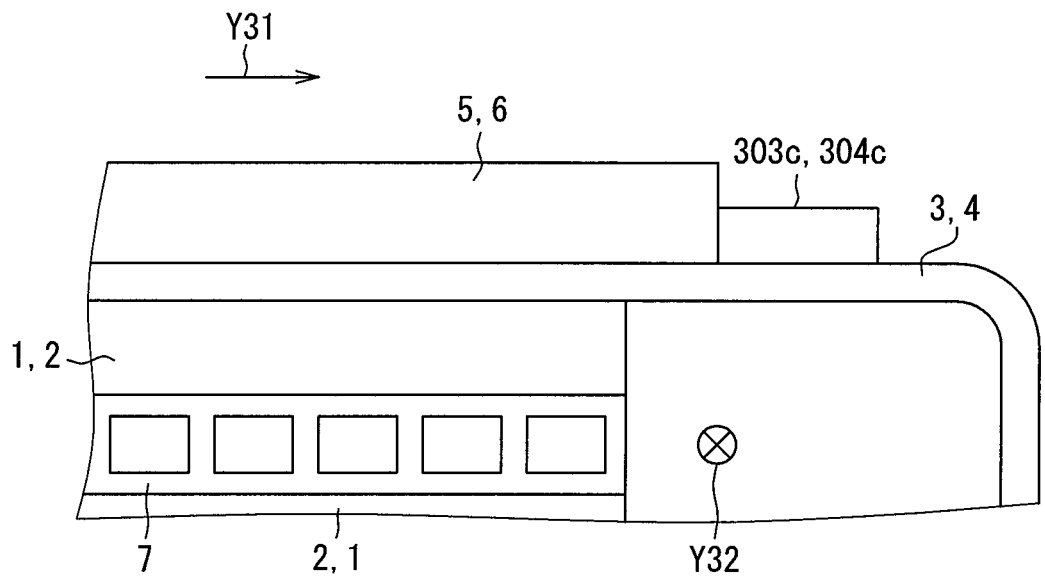
FIG. 31 is a partial side view to show a modification of the protruded part of the seventh embodiment.

Further, the rigidity reducing part 203*c* can be replaced by a rigidity reducing part 303*c* shown in FIG. 31. The rigidity reducing part 303*c* has a protruding height set to an equal height even if it is separate from the outside fin 5. The description relating to the rigidity reducing part 303*c* in the first outside plate 3 is the same as a rigidity reducing part 304*c* in the second outside plate 4. In the above description, the first outside plate 3 can be replaced by the second outside plate 4 and the rigidity reducing part 303*c* can be replaced by the rigidity reducing part 304*c*, respectively.

Each of the rigidity reducing parts 203*c*, 204*c*, 303, 304*c* has a portion overlapping an end portion of the outside fin 5. According to this construction, when the outside plates 3, 4 are pressed at the time of manufacturing, a stress caused when the outside plates 3, 4 are pressed can be dispersed by an overlapping structure of the outside fins 5, 6 and the respective rigidity reducing parts. Hence, it is possible to avoid a trouble such that the rigidity of the first outside plate 3 is greatly decreased near the end portion of the outside fin 5 and hence to improve the durability of the thermoelectric power generation device 100.

Eighth Embodiment

Next, an eighth embodiment will be described with reference to FIG. 32. In the eighth embodiment, the same reference signs as in the embodiments described above denote the same constructions as in the embodiments and the preceding descriptions will be used therefor.

A thermoelectric power generation device 100 of the eighth embodiment is different from the thermoelectric power generation device 100 of the first embodiment in a point such that the power generation module is provided only on one side of the duct 7.

A thermoelectric power generation device 100 of the eighth embodiment includes a duct 7 and a first power generation module 1 in contact with an outside surface opposite to the duct 7. The thermoelectric power generation device 100 further includes a first outside plate 3 which is in contact with an outside surface, which is a side opposite to the duct 7, of the first power generation module 1, and a second outside plate 4 which is in direct or indirect contact with an outside surface, which is a side opposite to the first power generation module 1, of the duct 7.

Figure 32:
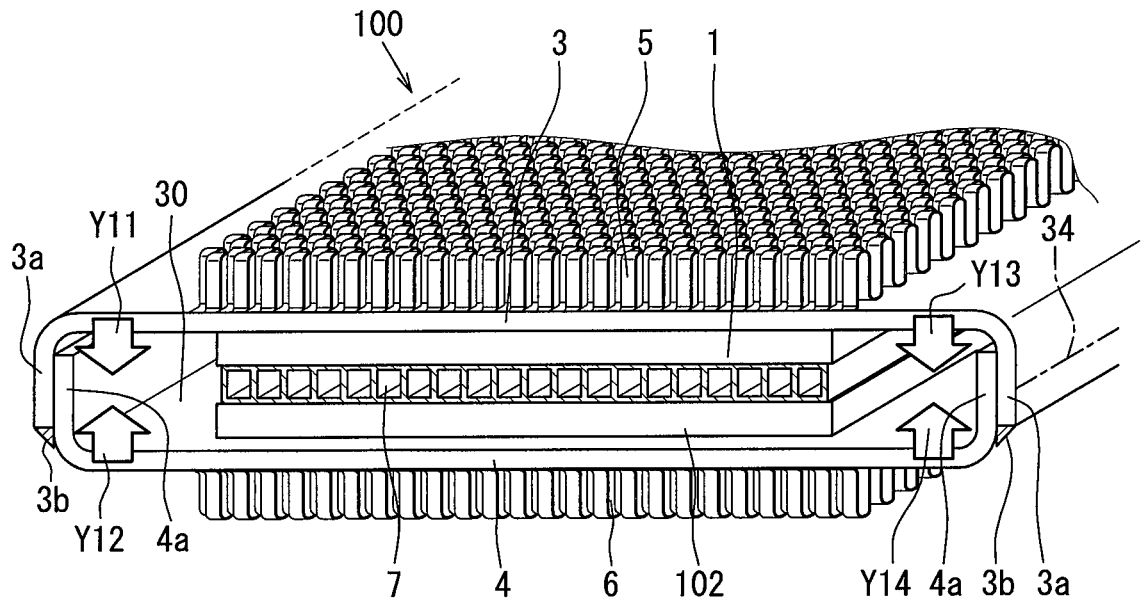
FIG. 32 is a perspective view of a thermoelectric power generation device of an eighth embodiment.

In an example shown in FIG. 32, the duct 7 is in contact with the second outside plate 4 via a heat conducting member 102. In other words, the duct 7 and the second outside plate 4 have the heat conducting member 102 interposed therebetween, so the duct 7 is in indirect contact with the second outside plate 4. Further, the thermoelectric power generation device 100 of the eighth embodiment can be also constructed in such a way that the duct 7 is in direct contact with the second outside plate 7 without the heat conducting member 102. The thermoelectric power generation device 100 of the eighth embodiment also can produce the same effects as in the respective embodiments described above.

Ninth Embodiment

Next, a ninth embodiment will be described with reference to FIG. 33. In the ninth embodiment, the same reference signs as in the embodiments described above denote the same constructions as in the embodiments and the preceding descriptions will be used therefor.

A thermoelectric power generation device 100 of the ninth embodiment is different from the thermoelectric power generation device 100 of the first embodiment in a point such that the first outside plate 3 and the second outside plate 4 are welded to each other at the bent portions 3a, 4a in a state where only one of the first outside plate 3 and the second outside plate 4 is elastically deformed.

Figure 33:
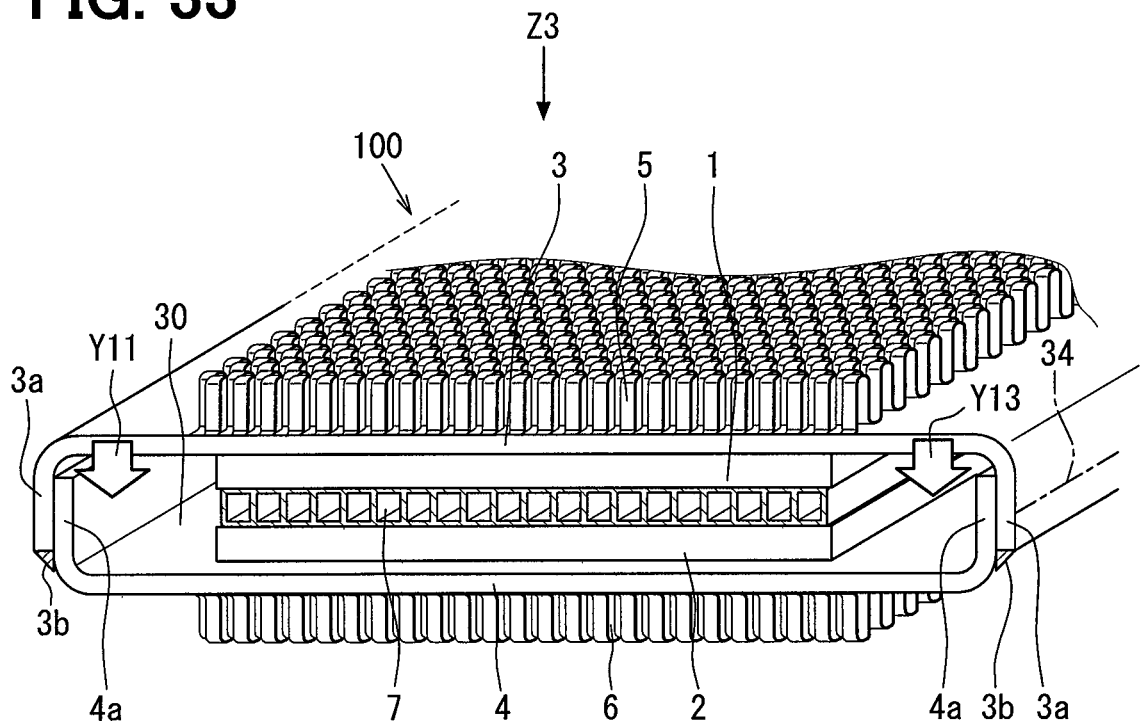
FIG. 33 is a perspective view of a thermoelectric power generation device of a ninth embodiment.

As shown in FIG. 33, the first outside plate 3 and the second outside plate 4 have the bent portions 3a, 4a, which are welded to each other in a resiliently deformed state in such a way that at least one of the first outside plate 3 and the second outside plate 4 come close to the other, at both ends of the first outside plate 3 and the second outside plate 4 in a direction orthogonal to a direction in which the low-temperature fluid flows. By welding the bent portions 3a, 4a to each other in this manner, there is produced a stress to press the first power generation module 1 and the second power generation module 2 onto the duct 7. The thermoelectric power generation device 100 of the ninth embodiment also can produce the same effects as the respective embodiments described above.

The embodiments have been described above. However, the present disclosure is not limited to the embodiments described above but can be variously modified within a scope not departing from the gist of the present disclosure. The structures of the above embodiments are absolutely shown as examples and the scope of the present disclosure is not limited to the scope described above. The scope of the present disclosure is shown by the scope of the claims and further includes all alterations equivalent to the description of the scope of the claims and within the scope of the claims. Modifications of the above embodiments will be described below.

In the first embodiment, as shown in FIG. 1, the first outside plate 3 is made smaller than the second outside plate 4 and the first outside plate 3 is combined with the second outside plate 4 in such a way that the first outside plate 3 covers the second outside plate 4. However, the first outside plate 3 and the second outside plate 4 may be formed in a same size and may be combined with each other in a state where they are shifted in position from each other.

In the first embodiment, the first outside plate 3 and the second outside plate 4 are welded to each other and the internal space 30 surrounded by the first outside plate 3 and the second outside plate 4 is hermetically sealed. However, the following is also recommended: the internal space 30 is not completely hermetically sealed but is sealed in such a hermetic degree that the high-temperature fluid of a high-temperature gas does not have a bad effect on the power generation modules 1, 2 received in the internal space 30. In other words, the first outside plate 3 and the second outside plate 4 may be spot-welded to each other at many spots.

In the first embodiment, the power generation modules 1, 2 are covered by the airtight case constructed of a stainless steel plate and many p-type semiconductor elements and many n-type semiconductor elements are alternately connected to each other in a shape of a net in the airtight case. However, the internal space 30 may be not airtight and many p-type semiconductor elements and many n-type semiconductor elements may be received in an exposed manner in the internal space 30 surrounded by the first outside plate 3 and the second outside plate 4. In other words, it is not essential that the internal space 30 is airtight. In this case, the internal space 30 can be hermetically sealed by a cover or the like.

Further, in the first embodiment, the first outside plate 3 and the second outside plate 4 have the bent portions 3a, 4a, which are resiliently deformed in such a way to come close to each other and then are welded to each other, at both their ends in a direction orthogonal to the direction in which the low-temperature fluid flows. Then, the stress to press the power generation modules 1, 2 onto the duct 7 or the like is generated by joining these bent portions 3a, 4a to each other. Joined surfaces of the bent portions 3a, 4a are made flat, but surfaces, which are formed in a depressed and projected shape constructing a serrated protruding shape or a labyrinth shape and which are inhibited from going back when engaged with each other, may be made on the joined surfaces.

In the first embodiment, portions in which the first outside plate 3 and the second outside plate 4 are in contact with the power generation modules 1, 2 are made to have flat surfaces but may be made to have surfaces having an arbitrary curved shape. In short, a uniform stress as far as possible only needs to be applied to the power generation modules 1, 2. Further, an inclusion such as a graphite sheet having excellent heat conduction may be sandwiched between the first outside plate 3 and the power generation module 1 and between the second outside plate 4 and the power generation module 2. In short, a uniform stress as far as possible only needs to be applied to the power generation modules 1, 2 to thereby conduct heat uniformly.

A low temperature fin to exchange heat with the low-temperature fluid may be provided in the duct 7. Further, in the first embodiment, the flow passage of the low-temperature fluid in the duct 7 is divided, but it is not essential that the flow passage is divided. Still further, the low temperature fin may be formed integrally with the duct 7. In this case, the low temperature fin may be a corrugated fin or a depressed and projected fin protruded from an inside wall surface of the duct 7.

In the first embodiment, the outside fins 5, 6 made of stainless steel or aluminum are joined to the outsides of the first outside plate 3 and the second outside plate 4 made of a steel plate or a stainless steel plate by brazing or the like, but the outside fins 5, 6 may be continuously formed integrally with the first outside plate 3 and the second outside plate 4. In this case, the outside fins 5, 6 may be corrugated fins protruded or bulged from the surfaces of the first outside plate 3 and the second outside plate 4.

In a case where the thermoelectric power generation device 100 shown in the first embodiment is made one unit and where a plurality of units are laminated to thereby construct the whole thermoelectric power generation device, each unit is inserted into a frame to hold the units. Then, the high-temperature fluid flows in the outside fins 5, 6 between the respective units and the low-temperature fluid flows separately in the respective ducts 7.

As the thermoelectric power generation device has been shown an example in which the exhaust gas of the automobile engine is used as the high-temperature fluid and in which the engine cooling water is used as the low-temperature fluid. However, a high-temperature gas of other industrial boiler may be used and the thermoelectric power generation device can be utilized not only for the automobile but also as an exhaust heat recovery device.

While the present disclosure has been described with reference to embodiments thereof, it is to be understood that the disclosure is not limited to the embodiments and constructions. The present disclosure is intended to cover various modification and equivalent arrangements. In addition, the various combinations and configurations, other combinations and configurations, including more, less or only a single element, are also within the spirit and scope of the present disclosure.

The invention claimed is:

1. A thermoelectric power generation device comprising:
a duct in which a low-temperature fluid flows;
a first power generation module and a second power generation module which are in contact with opposed outside surfaces of the duct respectively to sandwich the duct therebetween and each of which includes therein a thermoelectric power generation element;
a first outside plate and a second outside plate each of which is in contact with an outside surface of a corresponding one of the first power generation module and the second power generation module on its opposite side from the duct; and
outside fins each of which is provided on an outside surface of a corresponding one of the first outside plate and the second outside plate on its opposite side from a corresponding one of the first power generation module and the second power generation module, and which are in contact with a high-temperature fluid, wherein:
each of the first outside plate and the second outside plate includes bent portions at its both ends in a direction perpendicular to a direction in which the low-temperature fluid flows;
the bent portions of the first outside plate and the bent portions of the second outside plate are respectively welded together in a resiliently deformed state to approach each other;
each of the outside fins includes a plurality of wave portions;
a direction in which the plurality of wave portions overlap is parallel to a direction to connect the respective welded bent portions at the both ends of each of the first outside plate and the second outside plate, the outside fins having a first rigidity in the direction in which the plurality of wave portions overlap and a second rigidity in an orthogonal direction to the direction in which the plurality of wave portions overlap, the first rigidity being greater than the second rigidity; and
the bent portions of the first outside plate and the bent portions of the second outside plate are respectively welded together to generate stress that presses the first power generation module and the second power generation module on the duct.

2. The thermoelectric power generation device according to claim 1, wherein each of the first outside plate and the second outside plate is bent and resiliently deformed at end portions of a corresponding one of the first power generation module and the second power generation module, or outward of the end portions.

3. The thermoelectric power generation device according to claim 1, wherein the bent portions of the first outside plate and the bent portions of the second outside plate are respectively welded together by seam welding or laser welding along the direction in which the low-temperature fluid flows.

4. The thermoelectric power generation device according to claim 1, wherein:
the bent portions of the first outside plate and the bent portions of the second outside plate are respectively welded together to form an internal space between the first outside plate and the second outside plate; and
the first power generation module and the second power generation module are received in the internal space.

5. The thermoelectric power generation device according to claim 1, further comprising plate-shaped rigidity reinforcing members each of which is joined to a corresponding one of the outside fins on its opposite sides from a corresponding one of the first outside plate and the second outside plate.

6. The thermoelectric power generation device according to claim 1, wherein each of the outside fins is one of a plurality of outside fins, the thermoelectric power generation device further comprising a bar-shaped rigidity reinforcing member that extends between its corresponding plurality of outside fins in parallel to a direction in which the high-temperature fluid flows and that is joined to its adjacent corresponding plurality of outside fins and to a corresponding one of the first outside plate and the second outside plate.

7. The thermoelectric power generation device according to claim 1, further comprising a plurality of inside rigidity reinforcing members that are sandwiched between the first outside plate and the first power generation module and between the second outside plate and the second power generation module to respectively extend in parallel to a direction in which the high-temperature fluid flows, wherein the plurality of inside rigidity reinforcing members are joined to the first outside plate or the second outside plate.

8. The thermoelectric power generation device according to claim 1, wherein:
- each of the first outside plate and the second outside plate includes a reinforcing part on its surface on the duct side, which is an opposite side from a corresponding one of the outside fins; and
- the reinforcing part includes at least a portion overlapping with an end portion of the corresponding one of the outside fins.

9. The thermoelectric power generation device according to claim 8, wherein the reinforcing part is a protruded deformed part that is made by deforming the surface of each of the first outside plate and the second outside plate on the duct side to protrude.

10. The thermoelectric power generation device according to claim 9, wherein the protruded deformed part is provided from the portion overlapping with the end portion of the corresponding one of the outside fins to a corresponding one of the bent portions.

11. The thermoelectric power generation device according to claim 9, wherein the protruded deformed part is provided at a position that avoids a joining area between the each of the first outside plate and the second outside plate and a corresponding one of the outside fins.

12. The thermoelectric power generation device according to claim 8, wherein the reinforcing part is a block-shaped member that is provided integrally with the surface of each of the first outside plate and the second outside plate on the duct side.

13. The thermoelectric power generation device according to claim 12, wherein the block-shaped member is provided from the portion overlapping with the end portion of the corresponding one of the outside fins to a corresponding one of the bent portions.

14. The thermoelectric power generation device according to claim 8, wherein the reinforcing part is a rigidity reducing part that is provided adjacently to the corresponding one of the outside fins and that is lower in rigidity than the corresponding one of the outside fins.

15. A thermoelectric power generation device comprising:
- a duct in which a low-temperature fluid flows;
- a first power generation module and a second power generation module which are in contact with opposed outside surfaces of the duct respectively to sandwich the duct therebetween and each of which includes therein a thermoelectric power generation element;
- a first outside plate and a second outside plate each of which is in contact with an outside surface of a corresponding one of the first power generation module and the second power generation module on its opposite side from the duct; and
- outside fins each of which is provided on an outside surface of a corresponding one of the first outside plate and the second outside plate on its opposite side from a corresponding one of the first power generation module and the second power generation module, and which are in contact with a high-temperature fluid, wherein:
- each of the first outside plate and the second outside plate includes bent portions at its both ends in a direction perpendicular to a direction in which the low-temperature fluid flows;
- the bent portions of the first outside plate and the bent portions of the second outside plate are pressed together by pressing forces that generate a bending stress on the bent portions of the first outside plate and the bent portions of the second outside plate and are respectively welded together in a resiliently deformed state to approach each other, the first outside plate and the second outside plate having an increased rigidity in an orthogonal direction to a direction of the pressing forces to resist the bending stress;
- the bent portions of the first outside plate and the bent portions of the second outside plate are respectively welded together to generate stress that presses the first power generation module and the second power generation module on the duct, the thermoelectric power generation device, further comprising a plurality of inside rigidity reinforcing members that are sandwiched between the first outside plate and the first power generation module and between the second outside plate and the second power generation module to respectively extend in parallel to a direction in which the high-temperature fluid flows, wherein the plurality of inside rigidity reinforcing members are joined to the first outside plate or the second outside plate; and
- the outside fins have a first rigidity in the direction in which the high-temperature fluid flows and a second rigidity in an orthogonal direction to the direction in which the high-temperature fluid flows, the first rigidity being greater than the second rigidity.

16. The thermoelectric power generation device according to claim 15, wherein each of the first power generation module and the second power generation module includes a receiving groove that receives at least a part of a corresponding one of the plurality of inside rigidity reinforcing members.

17. The thermoelectric power generation device according to claim 15, wherein:
- each of the first power generation module and the second power generation module includes a plurality of power generation modules; and
- a divided portion is provided between each adjacent two of the plurality of power generation modules to receive at least a part of a corresponding one of the plurality of inside rigidity reinforcing members.

18. The thermoelectric power generation device according to claim 15, wherein:
- each of the first outside plate and the second outside plate includes a reinforcing part on its surface on the duct side, which is an opposite side from a corresponding one of the outside fins; and
- the reinforcing part includes at least a portion overlapping with an end portion of the corresponding one of the outside fins.

19. A thermoelectric power generation device comprising:
- a duct in which a low-temperature fluid flows;
- a first power generation module and a second power generation module which are in contact with opposed outside surfaces of the duct respectively to sandwich the duct therebetween and each of which includes therein a thermoelectric power generation element;
- a first outside plate and a second outside plate each of which is in contact with an outside surface of a corresponding one of the first power generation module and the second power generation module on its opposite side from the duct; and
- outside fins each of which is provided on an outside surface of a corresponding one of the first outside plate and the second outside plate on its opposite side from a corresponding one of the first power generation module and the second power generation module, and which are in contact with a high-temperature fluid, wherein:

each of the first outside plate and the second outside plate includes bent portions at its both ends in a direction perpendicular to a direction in which the low-temperature fluid flows;

the bent portions of the first outside plate and the bent portions of the second outside plate are respectively welded together in a resiliently deformed state to approach each other;

the bent portions of the first outside plate and the bent portions of the second outside plate are pressed together by pressing forces that generate a bending stress on the bent portions of the first outside plate and the bent portions of the second outside plate and are respectively welded together to generate stress that presses the first power generation module and the second power generation module on the duct, the first outside plate and the second outside plate having an increased rigidity in an orthogonal direction to a direction of the pressing forces to resist the bending stress;

each of the first outside plate and the second outside plate includes a reinforcing part on its surface on the duct side, which is an opposite side from a corresponding one of the outside fins;

the reinforcing part includes at least a portion overlapping with an end portion of the corresponding one of the outside fins; and the outside fins have a first rigidity in a direction in which the high-temperature fluid flows and a second rigidity in an orthogonal direction to the direction in which the high-temperature fluid flows, the first rigidity being greater than the second rigidity.

20. The thermoelectric power generation device according to claim 19, wherein the reinforcing part is a protruded deformed part that is made by deforming the surface of each of the first outside plate and the second outside plate on the duct side to protrude.

21. The thermoelectric power generation device according to claim 20, wherein the protruded deformed part is provided from the portion overlapping with the end portion of the corresponding one of the outside fins to a corresponding one of the bent portions.

22. The thermoelectric power generation device according to claim 20, wherein the protruded deformed part is provided at a position that avoids a joining area between the each of the first outside plate and the second outside plate and a corresponding one of the outside fins.

23. The thermoelectric power generation device according to claim 19, wherein the reinforcing part is a block-shaped member that is provided integrally with the surface of each of the first outside plate and the second outside plate on the duct side.

24. The thermoelectric power generation device according to claim 23, wherein the block-shaped member is provided from the portion overlapping with the end portion of the corresponding one of the outside fins to a corresponding one of the bent portions.

25. The thermoelectric power generation device according to claim 19, wherein the reinforcing part is a rigidity reducing part that is provided adjacently to the corresponding one of the outside fins and that is lower in rigidity than the corresponding one of the outside fins.

26. A thermoelectric power generation device comprising:
a duct in which a low-temperature fluid flows;
a first power generation module and a second power generation module which are in contact with opposed outside surfaces of the duct respectively to sandwich the duct therebetween and each of which includes therein a thermoelectric power generation element;
a first outside plate and a second outside plate each of which is in contact with an outside surface of a corresponding one of the first power generation module and the second power generation module on its opposite side from the duct; and
outside fins each of which is provided on an outside surface of a corresponding one of the first outside plate and the second outside plate on its opposite side from a corresponding one of the first power generation module and the second power generation module, and which are in contact with a high-temperature fluid, wherein:

each of the first outside plate and the second outside plate includes bent portions at its both ends in a direction perpendicular to a direction in which the low-temperature fluid flows;

the bent portions of the first outside plate and the bent portions of the second outside plate are pressed together by pressing forces that generate a bending stress on the bent portions of the first outside plate and the bent portions of the second outside plate and are respectively welded together in a resiliently deformed state such that at least one of the first outside plate and the second outside plate approaches the other one of the first outside plate and the second outside plate, the first outside plate and the second outside plate having an increased rigidity in an orthogonal direction to a direction of the pressing forces to resist the bending stress;

the bent portions of the first outside plate and the bent portions of the second outside plate are respectively welded together to generate stress that presses the first power generation module and the second power generation module on the duct;

each of the first outside plate and the second outside plate includes a reinforcing part on its surface on the duct side, which is an opposite side from a corresponding one of the outside fins;

the reinforcing part includes at least a portion overlapping with an end portion of the corresponding one of the outside fins; and the outside fins have a first rigidity in a direction in which the high-temperature fluid flows and a second rigidity in an orthogonal direction to the direction in which the high-temperature fluid flows, the first rigidity being greater than the second rigidity.

27. The thermoelectric power generation device according to claim 26, wherein the reinforcing part is a protruded deformed part that is made by deforming the surface of each of the first outside plate and the second outside plate on the duct side to protrude.

28. The thermoelectric power generation device according to claim 27, wherein the protruded deformed part is provided from the portion overlapping with the end portion of the corresponding one of the outside fins to a corresponding one of the bent portions.

29. The thermoelectric power generation device according to claim 27, wherein the protruded deformed part is provided at a position that avoids a joining area between the each of the first outside plate and the second outside plate and a corresponding one of the outside fins.

30. The thermoelectric power generation device according to claim 26, wherein the reinforcing part is a block-shaped member that is provided integrally with the surface of each of the first outside plate and the second outside plate on the duct side.

31. The thermoelectric power generation device according to claim 30, wherein the block-shaped member is provided from the portion overlapping with the end portion of the corresponding one of the outside fins to a corresponding one of the bent portions.

32. The thermoelectric power generation device according to claim 26, wherein the reinforcing part is a rigidity reducing part that is provided adjacently to the corresponding one of the outside fins and that is lower in rigidity than the corresponding one of the outside fins.

33. A thermoelectric power generation device comprising:
a duct in which a low-temperature fluid flows;
a power generation module that includes therein a thermoelectric power generation element and is in contact with one of opposed outside surfaces of the duct;
a first outside plate that is in contact with an outside surface of the power generation module on its opposite side from the duct;
a second outside plate that is in direct or indirect contact with the outside surface of the duct on its opposite side from the power generation module; and
outside fins each of which is provided on an outside surface of a corresponding one of the first outside plate and the second outside plate on its opposite side from the power generation module, and which are in contact with a high-temperature fluid, wherein:
each of the first outside plate and the second outside plate includes bent portions at its both ends in a direction perpendicular to a direction in which the low-temperature fluid flows;
the bent portions of the first outside plate and the bent portions of the second outside plate are pressed together by pressing forces that generate a bending stress on the bent portions of the first outside plate and the bent portions of the second outside plate and are respectively welded together in a resiliently deformed state such that at least one of the first outside plate and the second outside plate approaches the other one of the first outside plate and the second outside plate, the first outside plate and the second outside plate having an increased rigidity in an orthogonal direction to a direction of the pressing forces to resist the bending stress;
the bent portions of the first outside plate and the bent portions of the second outside plate are respectively welded together to generate stress that presses the power generation module on the duct;
each of the first outside plate and the second outside plate includes a reinforcing part on its surface on the duct side, which is an opposite side from a corresponding one of the outside fins;
the reinforcing part includes at least a portion overlapping with an end portion of the corresponding one of the outside fins;
the outside fins have a first rigidity in a direction in which the high-temperature fluid flows and a second rigidity in an orthogonal direction to the direction in which the high-temperature fluid flows, the first rigidity being greater than the second rigidity.

34. The thermoelectric power generation device according to claim 33, wherein the reinforcing part is a protruded deformed part that is made by deforming the surface of each of the first outside plate and the second outside plate on the duct side to protrude.

35. The thermoelectric power generation device according to claim 34, wherein the protruded deformed part is provided from the portion overlapping with the end portion of the corresponding one of the outside fins to a corresponding one of the bent portions.

36. The thermoelectric power generation device according to claim 34, wherein the protruded deformed part is provided at a position that avoids a joining area between the each of the first outside plate and the second outside plate and a corresponding one of the outside fins.

37. The thermoelectric power generation device according to claim 33, wherein the reinforcing part is a block-shaped member that is provided integrally with the surface of each of the first outside plate and the second outside plate on the duct side.

38. The thermoelectric power generation device according to claim 37, wherein the block-shaped member is provided from the portion overlapping with the end portion of the corresponding one of the outside fins to a corresponding one of the bent portions.

39. The thermoelectric power generation device according to claim 33, wherein the reinforcing part is a rigidity reducing part that is provided adjacently to the corresponding one of the outside fins and that is lower in rigidity than the corresponding one of the outside fins.

\* \* \* \* \*